United States Patent
Gates et al.

(10) Patent No.: US 6,704,133 B2
(45) Date of Patent: Mar. 9, 2004

(54) ELECTRO-OPTIC DISPLAY OVERLAYS AND SYSTEMS FOR ADDRESSING SUCH DISPLAYS

(75) Inventors: Holly G. Gates, Sommerville, MA (US); Ian Morrison, Acton, MA (US); Owen W. Ozier, Cambridge, MA (US); Benjamin M. Davis, San Francisco, CA (US); Jonathan D. Albert, Philadelphia, PA (US)

(73) Assignee: E-Ink Corporation, Cambridge, MA (US)

( * ) Notice: Subject to any disclaimer, the term of this patent is extended or adjusted under 35 U.S.C. 154(b) by 0 days.

(21) Appl. No.: 10/232,481

(22) Filed: Aug. 30, 2002

(65) Prior Publication Data

US 2003/0076573 A1 Apr. 24, 2003

Related U.S. Application Data

(63) Continuation-in-part of application No. 09/272,716, filed on Mar. 18, 1999, now Pat. No. 6,445,489.
(60) Provisional application No. 60/078,363, filed on Mar. 18, 1998, and provisional application No. 60/090,232, filed on Jun. 22, 1998.

(51) Int. Cl.[7] .................. G02B 26/00; G03G 17/04; G09G 3/34; C25D 15/00
(52) U.S. Cl. ............... 359/296; 359/267; 430/35; 345/107; 345/84; 204/478; 204/485
(58) Field of Search .................. 359/296, 243, 359/240; 345/107, 108, 44, 84; 430/35, 45; 204/478, 485

(56) References Cited

U.S. PATENT DOCUMENTS 3,036,388 A 5/1962 Tate
3,384,488 A 5/1968 Tulagin et al.
3,406,363 A 10/1968 Tate
3,460,248 A 8/1969 Tate
3,585,381 A 6/1971 Hodson et al.

(List continued on next page.)

FOREIGN PATENT DOCUMENTS

| DE | 195 00 694 A1 | 1/1995 |
| EP | 0 087 193 A2 | 2/1982 |
| EP | 0 186 710 A1 | 6/1984 |
| EP | 0 268 877 A2 | 6/1988 |
| EP | 0 268 877 A3 | 6/1988 |

(List continued on next page.)

OTHER PUBLICATIONS

Ackerman, J.; E Ink of Cambridge Gets Start–Up Funding; Dec. 24, 1997; D4; Boston Globe.
Amundson et al.; 12.3: Flexible, Active–Matrix Display Constructed Using a Microencapsulated Electrophoretic Material and an Organic–Semiconductor–Based Backplane; Jan. 1, 2001; 160–63; SID 01 Digest.
Beilin, et al.; 8.5: 2000–Character Electrophoretic Display; Jan. 1, 1986; 136–40; SID 86 Digest.
Blazo, S.F.; 10.1/9:00 A.M.: High Resolution Electrophoretic Display with Photoconductor Addressing; Jan. 1, 1982; 92–93; SID 82 Digest.

(List continued on next page.)

Primary Examiner—Loha Ben
(74) Attorney, Agent, or Firm—Testa, Hurwitz & Thibeault, LLP

(57) ABSTRACT

A display overlay includes a contrast media layer and a photoconductive layer disposed between two electrodes. Light from an emissive display strikes the photoconductive layer and lowers the impedance of the photoconductive layer at the point at which the light is incident. Voltage applied to the electrodes creates an electric field that addresses the contrast media layer in locations of reduced impedance.

42 Claims, 15 Drawing Sheets

U.S. PATENT DOCUMENTS

| | | | |
|---|---|---|---|
| 3,612,758 A | 10/1971 | Evans et al. | |
| 3,617,374 A | 11/1971 | Hodson et al. | |
| 3,668,106 A | 6/1972 | Ota | |
| 3,670,323 A | 6/1972 | Sobel et al. | |
| 3,756,693 A | * 9/1973 | Ots | 345/107 |
| 3,767,392 A | * 10/1973 | Ota | 430/35 |
| 3,792,308 A | 2/1974 | Ota | |
| 3,870,517 A | 3/1975 | Ota et al. | |
| 3,936,816 A | 2/1976 | Murata | |
| 3,959,906 A | 6/1976 | Norris, Jr. et al. | |
| 3,972,040 A | 7/1976 | Hilsum et al. | |
| 4,041,481 A | 8/1977 | Sato | |
| 4,045,327 A | 8/1977 | Noma et al. | |
| 4,062,009 A | 12/1977 | Raverdy et al. | |
| 4,068,927 A | 1/1978 | White | |
| 4,071,430 A | 1/1978 | Liebert | |
| 4,093,534 A | 6/1978 | Carter et al. | |
| 4,104,520 A | 8/1978 | Lewis et al. | |
| 4,126,528 A | 11/1978 | Chiang | |
| 4,126,854 A | 11/1978 | Sheridon | |
| 4,143,103 A | 3/1979 | Sheridon | |
| 4,143,472 A | 3/1979 | Murata et al. | |
| 4,149,149 A | 4/1979 | Miki et al. | |
| 4,185,621 A | 1/1980 | Morrow | |
| 4,196,437 A | 4/1980 | Hertz | |
| 4,203,106 A | 5/1980 | Dalisa et al. | |
| 4,218,302 A | 8/1980 | Dalisa et al. | |
| 4,251,747 A | 2/1981 | Burdick | |
| 4,272,596 A | 6/1981 | Harbour et al. | |
| 4,285,801 A | 8/1981 | Chiang | |
| 4,298,448 A | 11/1981 | Muller et al. | |
| 4,301,407 A | 11/1981 | Koslar | |
| 4,305,807 A | 12/1981 | Somlyody | |
| 4,311,361 A | 1/1982 | Somlyody | |
| 4,314,013 A | 2/1982 | Chang | |
| 4,336,536 A | 6/1982 | Kalt et al. | |
| 4,345,249 A | 8/1982 | Togashi | |
| 4,368,952 A | 1/1983 | Murata et al. | |
| 4,373,282 A | 2/1983 | Wragg | |
| 4,418,346 A | 11/1983 | Batchelder | |
| 4,430,648 A | 2/1984 | Togashi et al. | |
| 4,435,047 A | 3/1984 | Fergason | |
| 4,438,160 A | 3/1984 | Ishikawa et al. | |
| 4,450,440 A | 5/1984 | White | |
| 4,453,200 A | 6/1984 | Trcka et al. | |
| 4,500,880 A | 2/1985 | Gomersall et al. | |
| 4,502,934 A | 3/1985 | Gazard et al. | |
| 4,509,828 A | 4/1985 | Clerc et al. | |
| 4,522,472 A | 6/1985 | Liebert et al. | |
| 4,544,834 A | 10/1985 | Newport et al. | |
| 4,598,960 A | 7/1986 | DiSanto et al. | |
| 4,605,284 A | 8/1986 | Fergason | |
| 4,606,611 A | 8/1986 | Fergason | |
| 4,616,903 A | 10/1986 | Fergason | |
| 4,620,916 A | 11/1986 | Zwemer et al. | |
| 4,640,583 A | 2/1987 | Hoshikawa et al. | |
| 4,643,528 A | 2/1987 | Bell, Jr. | |
| 4,648,956 A | 3/1987 | Marshall et al. | |
| 4,655,897 A | 4/1987 | DiSanto et al. | |
| 4,684,219 A | 8/1987 | Cox et al. | |
| 4,686,524 A | 8/1987 | White | |
| 4,700,183 A | 10/1987 | White | |
| 4,703,573 A | 11/1987 | Montgomery et al. | |
| 4,707,080 A | 11/1987 | Fergason | |
| 4,707,593 A | 11/1987 | Murata et al. | |
| 4,726,662 A | 2/1988 | Cromack | |
| 4,730,186 A | 3/1988 | Koga et al. | |
| 4,732,456 A | 3/1988 | Fergason et al. | |
| 4,732,830 A | 3/1988 | DiSanto et al. | |
| 4,741,601 A | 5/1988 | Saito | |
| 4,741,604 A | 5/1988 | Kornfeld | |
| 4,742,345 A | 5/1988 | Di Santo et al. | |
| 4,746,917 A | 5/1988 | Di Santo et al. | |
| 4,772,102 A | 9/1988 | Fergason et al. | |
| 4,772,820 A | 9/1988 | DiSanto et al. | |
| 4,789,858 A | 12/1988 | Fergason et al. | |
| 4,794,390 A | 12/1988 | Lippman | |
| 4,821,291 A | 4/1989 | Stevens et al. | |
| 4,824,208 A | 4/1989 | Fergason et al. | |
| 4,832,458 A | 5/1989 | Fergason et al. | |
| 4,833,464 A | 5/1989 | Di Santo et al. | |
| 4,850,919 A | 7/1989 | DiSanto et al. | |
| 4,870,677 A | 9/1989 | Di Santo et al. | |
| 4,889,603 A | 12/1989 | DiSanto et al. | |
| 4,891,245 A | 1/1990 | Micale | |
| 4,892,607 A | 1/1990 | DiSanto et al. | |
| 4,931,019 A | 6/1990 | Park | |
| 4,937,586 A | 6/1990 | Stevens et al. | |
| 4,947,157 A | 8/1990 | Di Santo et al. | |
| 4,947,159 A | 8/1990 | Di Santo et al. | |
| 4,948,232 A | 8/1990 | Lange | |
| 4,949,081 A | 8/1990 | Keller et al. | |
| 4,962,466 A | 10/1990 | Revesz et al. | |
| 5,006,422 A | 4/1991 | Sakurai et al. | |
| 5,009,490 A | 4/1991 | Kouno et al. | |
| 5,016,002 A | 5/1991 | Levanto | |
| 5,028,841 A | 7/1991 | DiSanto et al. | |
| 5,041,824 A | 8/1991 | DiSanto et al. | |
| 5,042,917 A | 8/1991 | Fujita et al. | |
| 5,053,763 A | 10/1991 | DiSanto et al. | |
| 5,057,363 A | 10/1991 | Nakanishi | |
| 5,066,105 A | 11/1991 | Yoshimoto et al. | |
| 5,066,946 A | 11/1991 | Disanto et al. | |
| 5,067,021 A | 11/1991 | Brody | |
| 5,070,326 A | 12/1991 | Yoshimoto et al. | |
| 5,077,157 A | 12/1991 | DiSanto et al. | |
| 5,082,351 A | 1/1992 | Fergason | |
| 5,105,185 A | 4/1992 | Nakanowatari et al. | |
| 5,128,785 A | 7/1992 | Yoshimoto et al. | |
| 5,138,472 A | 8/1992 | Jones et al. | |
| 5,148,002 A | 9/1992 | Kuo et al. | |
| 5,151,032 A | 9/1992 | Igawa | |
| 5,155,607 A | 10/1992 | Inoue et al. | |
| 5,160,371 A | 11/1992 | Ito | |
| 5,161,007 A | 11/1992 | Takanashi et al. | |
| 5,167,508 A | 12/1992 | Mc Taggart | |
| 5,172,314 A | 12/1992 | Poland et al. | |
| 5,174,882 A | 12/1992 | DiSanto et al. | |
| 5,177,476 A | 1/1993 | DiSanto et al. | |
| 5,179,065 A | 1/1993 | Ito | |
| 5,185,226 A | 2/1993 | Grosso et al. | |
| 5,187,609 A | 2/1993 | DiSanto et al. | |
| 5,194,852 A | 3/1993 | More et al. | |
| 5,208,686 A | 5/1993 | Fergason | |
| 5,216,416 A | 6/1993 | DiSanto et al. | |
| 5,220,316 A | 6/1993 | Kazan | |
| 5,223,115 A | 6/1993 | DiSanto et al. | |
| 5,223,823 A | 6/1993 | Disanto et al. | |
| 5,233,459 A | 8/1993 | Bozler et al. | |
| 5,238,861 A | 8/1993 | Morin et al. | |
| 5,247,290 A | 9/1993 | Di Santo et al. | |
| 5,250,932 A | 10/1993 | Yoshimoto et al. | |
| 5,250,938 A | 10/1993 | DiSanto et al. | |
| 5,254,981 A | 10/1993 | Disanto et al. | |
| 5,258,864 A | 11/1993 | Shannon | |
| 5,262,098 A | 11/1993 | Crowley et al. | |
| 5,266,934 A | 11/1993 | Van Almen | |
| 5,266,937 A | 11/1993 | DiSanto et al. | |
| 5,270,843 A | 12/1993 | Wang | |
| 5,276,438 A | 1/1994 | DiSanto et al. | |
| 5,279,511 A | 1/1994 | DiSanto et al. | |

| Patent No. | Date | Inventor(s) |
|---|---|---|
| 5,279,694 A | 1/1994 | DiSanto et al. |
| 5,293,528 A | 3/1994 | DiSanto et al. |
| 5,298,833 A | 3/1994 | Hou |
| 5,302,235 A | 4/1994 | DiSanto et al. |
| 5,303,073 A | 4/1994 | Shirota et al. |
| 5,304,439 A | 4/1994 | Disanto et al. |
| 5,315,312 A | 5/1994 | DiSanto et al. |
| 5,344,594 A | 9/1994 | Sheridon |
| 5,345,251 A | 9/1994 | DiSanto et al. |
| 5,345,322 A | 9/1994 | Fergason |
| 5,358,355 A | 10/1994 | Brockway |
| 5,359,346 A | 10/1994 | DiSanto et al. |
| 5,360,689 A | 11/1994 | Hou et al. |
| 5,362,671 A | 11/1994 | Zavracky et al. |
| 5,371,815 A | 12/1994 | Poole |
| 5,380,362 A | 1/1995 | Schubert |
| 5,389,945 A | 2/1995 | Sheridon |
| 5,398,131 A | 3/1995 | Hall et al. |
| 5,402,145 A | 3/1995 | Disanto et al. |
| 5,403,518 A | 4/1995 | Schubert |
| 5,407,231 A | 4/1995 | Schwartz |
| 5,411,398 A | 5/1995 | Nakanishi et al. |
| 5,412,398 A | 5/1995 | DiSanto et al. |
| 5,450,069 A | 9/1995 | DiSanto et al. |
| 5,459,776 A | 10/1995 | Di Santo et al. |
| 5,460,688 A | 10/1995 | DiSanto et al. |
| 5,467,107 A | 11/1995 | DiSanto et al. |
| 5,485,176 A | 1/1996 | Ohara et al. |
| 5,490,005 A | 2/1996 | Jueliger |
| 5,497,171 A | 3/1996 | Teres et al. |
| 5,498,674 A | 3/1996 | Hou et al. |
| 5,499,038 A | 3/1996 | DiSanto et al. |
| 5,500,635 A | 3/1996 | Mott |
| 5,508,068 A | 4/1996 | Nakano |
| 5,508,720 A | 4/1996 | DiSanto et al. |
| 5,528,399 A | 6/1996 | Izumi et al. |
| 5,530,567 A | 6/1996 | Takei |
| 5,534,888 A | 7/1996 | Lebby et al. |
| 5,538,430 A | 7/1996 | Smith et al. |
| 5,541,478 A | 7/1996 | Troxell et al. |
| 5,543,219 A | 8/1996 | Elwakil |
| 5,548,282 A | 8/1996 | Escritt et al. |
| 5,561,443 A | 10/1996 | Disanto et al. |
| 5,565,885 A | 10/1996 | Tamanoi |
| 5,571,741 A | 11/1996 | Leedy |
| 5,573,711 A | 11/1996 | Hou et al. |
| 5,574,291 A | 11/1996 | Dodabalapur et al. |
| 5,575,554 A | 11/1996 | Guritz |
| 5,576,867 A | 11/1996 | Baur et al. |
| 5,582,700 A | 12/1996 | Bryning et al. |
| 5,583,675 A | 12/1996 | Yamada et al. |
| 5,596,208 A | 1/1997 | Dodabalapur et al. |
| 5,600,172 A | 2/1997 | McDevitt et al. |
| 5,609,978 A | 3/1997 | Giorgianni et al. |
| 5,614,427 A | 3/1997 | den Boer et al. |
| 5,627,561 A | 5/1997 | Laspina et al. |
| 5,635,317 A | 6/1997 | Taniguchi et al. |
| 5,638,103 A | 6/1997 | Obata et al. |
| 5,639,914 A | 6/1997 | Tomiyama et al. |
| 5,641,974 A | 6/1997 | den Boer et al. |
| 5,643,673 A | 7/1997 | Hou |
| 5,648,801 A | 7/1997 | Beardsley et al. |
| 5,650,247 A | 7/1997 | Taniguchi et al. |
| 5,663,739 A | 9/1997 | Pommerenke et al. |
| 5,684,501 A | 11/1997 | Knapp et al. |
| 5,686,383 A | 11/1997 | Long et al. |
| 5,689,282 A | 11/1997 | Wolfs et al. |
| 5,694,224 A | 12/1997 | Tai |
| 5,699,097 A | 12/1997 | Takayama et al. |
| 5,699,102 A | 12/1997 | Ng et al. |
| 5,705,826 A | 1/1998 | Aratani et al. |
| 5,707,738 A | 1/1998 | Hou |
| 5,707,747 A | 1/1998 | Tomiyama et al. |
| 5,708,525 A | 1/1998 | Sheridon |
| 5,715,026 A | 2/1998 | Shannon |
| 5,717,283 A | 2/1998 | Biegelsen et al. |
| 5,717,514 A | 2/1998 | Sheridon |
| 5,717,515 A | 2/1998 | Sheridon |
| 5,737,115 A | 4/1998 | Mackinlay et al. |
| 5,738,716 A | 4/1998 | Santilli et al. |
| 5,738,977 A | 4/1998 | Van Der Sluis-Van Der Voort et al. |
| 5,739,801 A | 4/1998 | Sheridon |
| 5,742,879 A | 4/1998 | Altrieth, III |
| 5,744,283 A | 4/1998 | Spierings et al. |
| 5,745,094 A | 4/1998 | Gordon, II et al. |
| 5,751,257 A | 5/1998 | Sutherland |
| 5,751,268 A | 5/1998 | Sheridon |
| 5,751,433 A | 5/1998 | Narendranath et al. |
| 5,751,434 A | 5/1998 | Narendranath et al. |
| 5,754,332 A | 5/1998 | Crowley |
| 5,759,671 A | 6/1998 | Tanaka et al. |
| 5,760,761 A | 6/1998 | Sheridon |
| 5,767,826 A | 6/1998 | Sheridon et al. |
| 5,767,978 A | 6/1998 | Revankar et al. |
| 5,777,782 A | 7/1998 | Sheridon |
| 5,783,614 A | 7/1998 | Chen et al. |
| 5,786,875 A | 7/1998 | Brader et al. |
| 5,801,664 A | 9/1998 | Seidensticker et al. |
| 5,808,783 A | 9/1998 | Crowley |
| 5,815,306 A | 9/1998 | Sheridon et al. |
| 5,825,529 A | 10/1998 | Crowley |
| 5,828,432 A | 10/1998 | Shashidhar et al. |
| 5,835,577 A | 11/1998 | Disanto et al. |
| 5,872,552 A | 2/1999 | Gordon, II et al. |
| 5,874,746 A | 2/1999 | Holmberg et al. |
| 5,880,705 A | 3/1999 | Onyskevych et al. |
| 5,892,244 A | 4/1999 | Tanaka et al. |
| 5,892,504 A | 4/1999 | Knapp |
| 5,894,367 A | 4/1999 | Sheridon |
| 5,900,858 A | 5/1999 | Richley |
| 5,914,698 A | 6/1999 | Nicholson et al. |
| 5,914,806 A | 6/1999 | Gordon II et al. |
| 5,917,199 A | 6/1999 | Byun et al. |
| 5,922,268 A | 7/1999 | Sheridon |
| 5,930,026 A | 7/1999 | Jacobson et al. |
| 5,958,169 A | 9/1999 | Titterington et al. |
| 5,961,804 A | 10/1999 | Jacobson et al. |
| 5,963,456 A | 10/1999 | Klein et al. |
| 5,972,493 A | 10/1999 | Iwasaki et al. |
| 5,975,680 A | 11/1999 | Wen et al. |
| 5,978,052 A | 11/1999 | Ilcisin et al. |
| 5,982,346 A | 11/1999 | Sheridon et al. |
| 5,986,622 A | 11/1999 | Ong |
| 5,989,945 A | 11/1999 | Yudasaka et al. |
| 6,017,584 A | 1/2000 | Albert et al. |
| 6,025,896 A | 2/2000 | Hattori et al. |
| 6,045,955 A | 4/2000 | Vincent |
| 6,051,957 A | 4/2000 | Klein |
| 6,055,091 A | 4/2000 | Sheridon et al. |
| 6,064,091 A | 5/2000 | Deane et al. |
| 6,064,784 A | 5/2000 | Whitehead et al. |
| 6,076,094 A | 6/2000 | Cohen et al. |
| 6,097,531 A | 8/2000 | Sheridon |
| 6,105,290 A | 8/2000 | Coates et al. |
| 6,113,810 A | 9/2000 | Hou et al. |
| 6,117,294 A | 9/2000 | Rasmussen |
| 6,117,368 A | 9/2000 | Hou |
| 6,118,426 A | 9/2000 | Albert et al. |
| 6,120,588 A | 9/2000 | Jacobson |
| 6,120,839 A | 9/2000 | Comiskey et al. |
| 6,124,851 A | 9/2000 | Jacobson |

| | | | | | | |
|---|---|---|---|---|---|---|
| 6,130,773 | A | 10/2000 | Jacobson et al. | EP | 0 555 982 | 8/1993 |
| 6,130,774 | A | 10/2000 | Albert et al. | EP | 0 570 995 B1 | 11/1993 |
| 6,137,467 | A | 10/2000 | Sheridon et al. | EP | 0 570 995 A1 | 11/1993 |
| 6,140,980 | A | 10/2000 | Spitzer et al. | EP | 0 575 475 B1 | 12/1993 |
| 6,144,361 | A | 11/2000 | Gordon, II et al. | EP | 0 585 000 | 3/1994 |
| 6,146,716 | A | 11/2000 | Narang | EP | 0 586 373 B1 | 3/1994 |
| 6,153,075 | A | 11/2000 | Nemelka | EP | 0 586 545 B1 | 3/1994 |
| 6,171,464 | B1 | 1/2001 | Chadha | EP | 0 595 812 B1 | 5/1994 |
| 6,172,798 | B1 | 1/2001 | Albert et al. | EP | 0 600 878 B1 | 6/1994 |
| 6,177,921 | B1 | 1/2001 | Comiskey et al. | EP | 0 601 072 B1 | 6/1994 |
| 6,184,856 | B1 | 2/2001 | Gordon, II et al. | EP | 0 601 075 B1 | 6/1994 |
| 6,198,809 | B1 | 3/2001 | Disanto et al. | EP | 0 604 423 B1 | 7/1994 |
| 6,215,920 | B1 | 4/2001 | Whitehead et al. | EP | 0 618 715 A1 | 10/1994 |
| 6,219,160 | B1 | 4/2001 | Nordal et al. | EP | 0 622 721 A1 | 11/1994 |
| 6,225,971 | B1 | 5/2001 | Gordon, II et al. | EP | 0 685 101 B1 | 12/1995 |
| 6,232,950 | B1 | 5/2001 | Albert et al. | EP | 0708 798 B1 | 5/1996 |
| 6,239,896 | B1 | 5/2001 | Ikeda | EP | 0 709 713 A2 | 5/1996 |
| 6,252,564 | B1 | 6/2001 | Albert et al. | EP | 0 717 446 A2 | 6/1996 |
| 6,262,706 | B1 | 7/2001 | Albert et al. | EP | 0 721 176 A3 | 7/1996 |
| 6,262,833 | B1 | 7/2001 | Loxley et al. | EP | 0 721 176 A2 | 7/1996 |
| 6,271,823 | B1 | 8/2001 | Gordon, II et al. | EP | 0 889 425 A1 | 1/1999 |
| 6,274,412 | B1 | 8/2001 | Kydd et al. | EP | 0 717 446 A3 | 2/1999 |
| 6,287,899 | B1 | 9/2001 | Park et al. | EP | 0 899 651 A2 | 3/1999 |
| 6,300,932 | B1 | 10/2001 | Albert | EP | 0 924 551 A1 | 6/1999 |
| 6,312,304 | B1 | 11/2001 | Duthaler et al. | EP | 0 962 808 A2 | 12/1999 |
| 6,312,971 | B1 | 11/2001 | Amundson et al. | EP | 0 708 798 B1 | 4/2000 |
| 6,323,989 | B1 | 11/2001 | Jacobson et al. | EP | 1 000 741 A2 | 5/2000 |
| 6,327,072 | B1 | 12/2001 | Comiskey et al. | EP | 1 024 540 A2 | 8/2000 |
| 6,348,908 | B1 | 2/2002 | Richley et al. | EP | 1 089 118 A2 | 4/2001 |
| 6,353,746 | B1 | 3/2002 | Javitt | FR | 2 693 005 | 12/1993 |
| 6,376,828 | B1 | 4/2002 | Comiskey | GB | 1 314 906 | 4/1973 |
| 6,377,387 | B1 | 4/2002 | Duthaler et al. | GB | 2 044 508 A | 10/1980 |
| 6,392,785 | B1 | 5/2002 | Albert et al. | GB | 2 094 044 A | 9/1982 |
| 6,413,790 | B1 | 7/2002 | Duthaler et al. | GB | 2 255 934 A | 11/1992 |
| 6,422,687 | B1 | 7/2002 | Jacobson | GB | 2 292 119 A | 2/1996 |
| 6,438,882 | B1 | 8/2002 | Reynolds | GB | 2 306 229 A | 4/1997 |
| 6,445,374 | B2 | 9/2002 | Albert et al. | GB | 2 324 273 A | 10/1998 |
| 6,459,418 | B1 | 10/2002 | Comiskey et al. | JP | 53-73098 | 6/1978 |
| 6,473,072 | B1 | 10/2002 | Comiskey et al. | JP | 54-152497 | 11/1979 |
| 6,480,182 | B2 | 11/2002 | Turner et al. | JP | 59098227 | 6/1984 |
| 6,504,524 | B1 | 1/2003 | Gates et al. | JP | 60189731 | 9/1985 |
| 6,506,438 | B2 | 1/2003 | Duthaler et al. | JP | 62269124 | 5/1986 |
| 6,512,354 | B2 | 1/2003 | Jacobson et al. | JP | 62058222 | 3/1987 |
| 6,515,649 | B1 | 2/2003 | Albert et al. | JP | 9-185087 | 7/1987 |
| 2002/0021270 | A1 | 2/2002 | Albert | JP | 62231930 | 10/1987 |
| 2002/0130832 | A1 | 9/2002 | Baucom et al. | JP | 62299824 | 12/1987 |
| 2002/0145792 | A1 | 10/2002 | Jacobson et al. | JP | 63-006632 | 1/1988 |
| 2002/0154382 | A1 | 10/2002 | Morrison et al. | JP | 01086116 | 3/1989 |

FOREIGN PATENT DOCUMENTS

| | | |
|---|---|---|
| EP | 0 325 013 B1 | 7/1989 |
| EP | 0 325 013 A1 | 7/1989 |
| EP | 0 344 367 A1 | 12/1989 |
| EP | 0 344 367 B1 | 12/1989 |
| EP | 0 361 420 A2 | 4/1990 |
| EP | 0 362 928 A1 | 4/1990 |
| EP | 0 363 030 A2 | 4/1990 |
| EP | 0 363 030 B1 | 4/1990 |
| EP | 0 390 303 A2 | 10/1990 |
| EP | 0 396 247 A2 | 11/1990 |
| EP | 0 396 247 B1 | 11/1990 |
| EP | 0 404 545 A2 | 12/1990 |
| EP | 0 417 362 A1 | 3/1991 |
| EP | 0 417 362 B1 | 3/1991 |
| EP | 0 443 571 A2 | 8/1991 |
| EP | 0 448 853 A1 | 10/1991 |
| EP | 0 448 853 B1 | 10/1991 |
| EP | 0 460 747 A2 | 12/1991 |
| EP | 0 525 852 A1 | 2/1993 |
| EP | 0 525 852 B1 | 2/1993 |
| EP | 0 540 281 A2 | 5/1993 |

| | | |
|---|---|---|
| JP | 01086117 A | 3/1989 |
| JP | 64 86116 | 3/1989 |
| JP | 1-88986 | 4/1989 |
| JP | 1125613 A | 5/1989 |
| JP | 01125613 | 5/1989 |
| JP | 01142537 A | 6/1989 |
| JP | 01177517 | 7/1989 |
| JP | 01248182 A | 10/1989 |
| JP | 01267525 | 10/1989 |
| JP | 02223934 A | 9/1990 |
| JP | 02223935 A | 9/1990 |
| JP | 02223936 A | 9/1990 |
| JP | 02284124 A | 11/1990 |
| JP | 02284125 A | 11/1990 |
| JP | 03053114 A | 3/1991 |
| JP | 3053224 | 3/1991 |
| JP | 03091722 A | 4/1991 |
| JP | 3091722 | 4/1991 |
| JP | 03096925 A | 4/1991 |
| JP | 3096925 | 4/1991 |
| JP | 3118196 | 5/1991 |
| JP | 04 029291 | 1/1992 |
| JP | 4060518 A | 2/1992 |

| | | | | | | |
|---|---|---|---|---|---|---|
| JP | 04060518 | 2/1992 | | WO | WO 92/12453 | 7/1992 |
| JP | 04199638 | 7/1992 | | WO | WO 92/17873 | 10/1992 |
| JP | 4307523 | 10/1992 | | WO | WO 92/20060 | 11/1992 |
| JP | 04345133 A | 12/1992 | | WO | WO 92/21733 | 12/1992 |
| JP | 4-355786 | 12/1992 | | WO | WO 93/02443 | 2/1993 |
| JP | 55096922 | 3/1993 | | WO | WO 93/04458 | 3/1993 |
| JP | 05165064 A | 6/1993 | | WO | WO 93/04459 | 3/1993 |
| JP | 05173194 A | 7/1993 | | WO | WO 93/05425 | 3/1993 |
| JP | 05307197 A | 11/1993 | | WO | WO 93/07608 | 4/1993 |
| JP | 6089081 | 3/1994 | | WO | WO 93/17414 | 9/1993 |
| JP | 07036020 | 2/1995 | | WO | WO 93/18428 | 9/1993 |
| JP | 2551783 | 8/1996 | | WO | WO 94/16427 | 7/1994 |
| JP | 08234176 | 9/1996 | | WO | WO 94/19789 | 9/1994 |
| JP | 9-6277 | 1/1997 | | WO | WO 94/24236 | 10/1994 |
| JP | 9006508 A | 1/1997 | | WO | WO 95/02636 | 1/1995 |
| JP | 09016116 | 1/1997 | | WO | WO 95/06307 | 3/1995 |
| JP | 9031453 A | 2/1997 | | WO | WO 95/07527 | 3/1995 |
| JP | 10-48673 | 2/1998 | | WO | WO 95/10107 | 4/1995 |
| JP | 10142628 | 5/1998 | | WO | WO 95/15363 | 6/1995 |
| JP | 10149118 A | 6/1998 | | WO | WO 95/19227 | 7/1995 |
| JP | 10 149118 | 6/1998 | | WO | WO 95/27924 | 10/1995 |
| JP | 10-161161 | 6/1998 | | WO | WO 95/33085 | 12/1995 |
| JP | 11073004 | 3/1999 | | WO | WO 96/13469 | 5/1996 |
| JP | 11073083 | 3/1999 | | WO | WO 97/04398 | 2/1997 |
| JP | 11084953 | 3/1999 | | WO | WO 97/20274 | 6/1997 |
| JP | 11143201 | 5/1999 | | WO | WO 97/24907 | 7/1997 |
| JP | 11153929 | 6/1999 | | WO | WO 97/35298 | 9/1997 |
| JP | 11202804 | 7/1999 | | WO | WO 98/03896 | 1/1998 |
| JP | 11212499 | 8/1999 | | WO | WO 98/19208 | 5/1998 |
| JP | 11219135 | 8/1999 | | WO | WO 98/41898 | 9/1998 |
| JP | 11237851 | 8/1999 | | WO | WO 98/41899 | 9/1998 |
| JP | 11264812 | 9/1999 | | WO | WO 99/03087 | 1/1999 |
| JP | 11352526 | 12/1999 | | WO | WO 99/05236 | 2/1999 |
| JP | 00066247 | 3/2000 | | WO | WO 99/05237 | 2/1999 |
| JP | 00066248 | 3/2000 | | WO | WO 99/05238 | 2/1999 |
| JP | 00066249 | 3/2000 | | WO | WO 99/05645 | 2/1999 |
| JP | 00089260 | 3/2000 | | WO | WO 99/05646 | 2/1999 |
| JP | 00127478 | 5/2000 | | WO | WO 99/10767 | 3/1999 |
| JP | 00137250 | 5/2000 | | WO | WO 99/10768 | 3/1999 |
| JP | 00140582 | 5/2000 | | WO | WO 99/10769 | 3/1999 |
| JP | 00162650 | 6/2000 | | WO | WO 99/27414 | 6/1999 |
| JP | 00171839 | 6/2000 | | WO | WO 99/41728 | 8/1999 |
| JP | 00194020 | 7/2000 | | WO | WO 99/41732 | 8/1999 |
| JP | 00194021 | 7/2000 | | WO | WO 99/41787 | 8/1999 |
| JP | 00206574 | 7/2000 | | WO | WO 99/41788 | 8/1999 |
| JP | 00221546 | 8/2000 | | WO | WO 99/47970 | 9/1999 |
| JP | 00227612 | 8/2000 | | WO | WO 99/53371 | 10/1999 |
| JP | 00231307 | 8/2000 | | WO | WO 99/53373 | 10/1999 |
| JP | 00258805 | 9/2000 | | WO | WO 99/56171 | 11/1999 |
| JP | 00259102 | 9/2000 | | WO | WO 99/59101 | 11/1999 |
| JP | 00285219 | 10/2000 | | WO | WO 99/65011 | 12/1999 |
| JP | 00315253 | 11/2000 | | WO | WO 99/65012 | 12/1999 |
| JP | 00321605 | 11/2000 | | WO | WO 00/03291 | 1/2000 |
| JP | 00322001 | 11/2000 | | WO | WO 00/03349 | 1/2000 |
| JP | 00322002 | 11/2000 | | WO | WO 00/05704 | 2/2000 |
| JP | 00322003 | 11/2000 | | WO | WO 00/08689 | 2/2000 |
| JP | 00322004 | 11/2000 | | WO | WO 00/10048 | 2/2000 |
| JP | 00322005 | 11/2000 | | WO | WO 00/16189 | 3/2000 |
| JP | 00322006 | 11/2000 | | WO | WO 00/20922 | 4/2000 |
| JP | 00322007 | 11/2000 | | WO | WO 00/20923 | 4/2000 |
| JP | 00352946 | 12/2000 | | WO | WO 00/26761 | 5/2000 |
| JP | 01005040 | 1/2001 | | WO | WO 00/36465 | 6/2000 |
| JP | 01020093 | 1/2001 | | WO | WO 00/36560 | 6/2000 |
| JP | 01033831 | 2/2001 | | WO | WO 00/36666 | 6/2000 |
| JP | 01045412 | 2/2001 | | WO | WO 00/49593 | 8/2000 |
| JP | 01051490 | 2/2001 | | WO | WO 00/54101 | 9/2000 |
| JP | 01056653 | 2/2001 | | WO | WO 00/75720 | 12/2000 |
| JP | 06239896 | 5/2001 | | WO | WO 00/77570 | 12/2000 |
| WO | WO 82/02961 | 9/1982 | | WO | WO 00/77571 | 12/2000 |
| WO | WO 90/08402 | 7/1990 | | WO | WO 01/11424 | 1/2001 |
| WO | WO 92/09061 | 5/1992 | | WO | WO 01/18090 | 3/2001 |

| WO | WO 01/40856 A1 | 6/2001 |
| WO | WO 01/65309 A1 | 9/2001 |
| WO | WO 01/67170 A1 | 9/2001 |
| WO | WO 01/86346 A1 | 11/2001 |
| WO | WO 02/057843 A2 | 7/2002 |
| WO | WO 02/079869 A1 | 10/2002 |

OTHER PUBLICATIONS

Bohnke et al.; Polymer–Based Solid Electrochromic Cell for Matrix–Addressable Display Devices; Dec. 1, 1991; 3612–17; Journal of the Electrochemical Society; 138(12).

Business Wire; E Ink and Lucent Technologies Demonstrate World's First Flexible Electronic Ink Display with Plastic Transistors; Nov. 20, 2000; http://www.zdnet.com/cgi–bin/printme.fcgi?t=zdii.

Cameron, David; Flexible Displays Gain Momentum; Jan. 22, 2002; An MIT Enterprise—Technology Review—Emerging Technologies and Their Impact.

Chen et al.; 12.2: A Conformable Electronic Ink Display Using a Foil–Based a–Si TFT Array; Jan. 1, 2001; 157–59; SID 01 Digest.

Chiang et al.; 11.5/4:10 P.M.: A High Speed Electrophoretic Matrix Display; Jan. 1, 1980; 114–115; SID 80 Digest.

Chiang et al.; 7.5/4:05 P.M.: A Stylus Writable Electrophoretic Display Device; Jan. 1, 1979; 44–45; SID 79 Digest.

Chiang, A.; Conduction Mechanism of Charge Control Agents Used in Electrophoretic Display Devices; Jul. 1, 1977; 275–282; Proceeding of the S.I.D.; 18(3 & 4).

Chiang, A.; Reduction of Lateral Migration in Matrix Addressed Electrophoretic Display; Jan. 1, 1980; 73–74; Xerox Disclosure Journal; 5(1).

Comiskey et al.; 7.4L: Late–News Paper: Electrophoretic Ink: A Printable Display Material; Jan. 1; 1997; 75–76; SID 97 Digest.

Comiskey et al.; An Electrophoretic Ink for All–Printed Reflective Electronic Displays; Jul. 16, 1998; 253–55; Nature; 394.

Croucher et al.; Electrophoretic Display: Materials as Related to Performance; Mar. 1, 1981; 80–86; Photographic Science and Engineering; 25(2).

Dalisa, A. L.; Electrophoretic Display Technology; Jul. 1, 1977; 827–34; IEEE Transactions on Electron Devices; 24(7).

Dalisa, A.L.; Electrophoretic Displays; Jan. 1, 1980; 215–232; Display Devices.

Drzaic et al.; A Printed and Rollable Bistable Electronic Display; Jan. 1, 1998; 1131–34; 1998 SID International Symposium, Digest of Technical Papers; 29.

Duthhaler et al.; Active–Matrix Color Displays Using Electrophoretic Ink and Color Filters; Jan. 1, 2002; 1374–1377; SID 02 Digest.

Fitzhenry, B.; Identification of a Charging Mechanism using Infrared Spectroscopy; Jan. 1, 1979; 107–110; Applied Spectroscopy; 33(2).

Fitzhenry–Ritz, B.; Optical Properties of Electrophoretic Image Displays; Jan. 1, 1981; 300–09; Proceedings of the SID; 22(4).

Fitzhenry–Ritz, B.; Optical Effects of Adsorption of dyes on Pigment Used in Electrophoretic Image Displays; Oct. 1, 1979; 3332–37; Applied Optics; 18(19).

Goodman, L.A.; Passive Liquid Displays: Liquid Crystals, Electrophoretics, and Electrochromics; Jan. 1, 1976; 30–38; Proceeding of the S.I.D.; 17(1).

Harbour et al.; Subdivided Electrophoretic Display; Jan. 1, 1979; 705; Xerox Disclosure Journal; 4(6).

Hatano et al.; 18.3: Bistable Paper–White Display Device Using Cholesteric Liquid Crystals; Jan. 1, 1996; 269–72; SID 96 Digest.

Hopper et al.; An Electrophoretic Display, Its Properties, Model, and Addressing; Aug. 1, 1979; 1148–52; IEEE Transactions on Electron Devices; Ed–26, No. 8.

Hou et al.; 12.4: Active Matrix Electrophoretic Displays Containing Black and White Particles with Opposite Polarities; Jan. 1, 2001; 164–67; SID 01 Digest.

Jackson et al.; Organic Thin–Film Transistors for Organic Light–Emitting Flat–Panel Display Backplanes; Jan. 1, 1998; IEEE Journal of Selected Topics in Quantum Electronics; 4(1).

Jacobson et al.; The Last Book; Jan. 1, 1997; 457–463; IBM Systems Journa; 36(3).

Ji et al.; P–50: Polymer Walls in Higher–Polymer–Content Bistable Reflective Cholesteric Displays; Jan. 1, 1996; 611–13; SID 96 Digest.

Jo et al.; Toner Display Based on Particle Movements; Jan. 1, 2002; 664–669; Chem. Mater.; 14(2).

Kazlas et al.; 12.1:12.1"SVGA Microencapsulated Electrophoretic Active Matrix Display for Information Appliances; Jan. 1, 2001; 152–55; SID 01 Digest.

Kenward, M.; Displaying a Winning Glow; Jan. 1, 1999; 69–73; Technology Review.

Kornfeld, C.; 9.5: A Defect–Tolerant Active Matrix Electrophoretic Display; Jan. 1, 1984; 142–44; SID 84 Digest.

Lee, L. L.; A Magnetic–Particles Display; Jul. 1, 1975; 177–184; Proceeding of the S.I.D.; 16(3).

Lee, L. L.; Fabrication of Magnetic Particles Display; Jul. 1, 1977; 283–88; Proceeding of the S.I.D.; 18(3,4).

Lewis J.C.; Electrophoretic Displays; 223–240; Nonemissive Electrooptic Displays (Plenum Press).

Lewis, et al.; Gravitational, Inter–Particle and Particle–Electrode Forces in the Electrophoretic Display; Jul. 1, 1977; 235–42; Proceeding of the S.I.D.; 18(3,4).

Minnema et al.; Pattern Generationin Polyimide Coatings and Its Application in an Electrophoretic Image Display; Jun. 1, 1988; 815–22; Polymer Engineering and Science; 28(12).

Mürau et al.; The Understanding and Elimination of Some Suspension Instabilities in an Electrophoretic Display; Sep. 1, 1978; 4820–29; Journal of Applied Physics; 49(9).

Murau, P.; 9.4: Characteristics of an X–Y Addressed Electrophorectic Image Display (EPID); Jan. 1, 1984; 141; SID 84 Digest.

Nakamura et al.; 37.3: Development of Electrophoretic Display Using Microencapsulated Suspension,; May 1, 1998; 1014–17; 1998 ISD International Symposium Disgust of Technical Papers, Proceedings of SID '98 International Symposium, Anaheim, CA, USA; 29.

Negroponte et al.; Surfaces and Displays; Jan. 1, 1997; 212; Wired.

Ota et al.; Electrophoretic Image Display (EPID) Panel, Proceedings of the IEEE; Jan. 1, 1973; 1–5.

Ota et al.; Developments in Electrophoretic Displays; Jul. 1, 1977; 243–54; Proceedings of the S.I.D.; 18(3,4).

Ota et al.; Electrophoretic Display Devices; Jan. 1, 1975; 145–48, Laser 75 Optoelectronics Conference Proceedings.

Pankove, J.I.; Color Reflection Type Display Panel; Mar. 1, 1962; 2 sheets; RCA Technical Notes; 535.

Pitt, M.G.; 53.2: Power Consumption of Micro–encapsulated Electrophoretic Displays for Smart Handheld Applications; Jan. 1, 2002; 1378–1381; SID 02 Digest.

Quon, W. S.; Multilevel Voltage Select (MLVS): A Novel Technique to X–Y Address an Electrophoretic Image Display; Aug. 1, 1977; 1121–23; IEEE Transactions on Electron Devices; 24(8).

Saitoh et al.; A Newly Developed Electrical Twisting Ball Display; Jan. 1, 1982; 249–53; Proceedings of the SID; 23(4).

Sankus, J.; Electrophoretic Display Cell; May 1, 1979; 309; Xerox Disclosure Journal; 4(3).

Sheridon et al.; The Gyricon—A Twisting Ball Display; Jul. 1, 1977; 289–93; Proceeding of the S.I.D.; 18(3,4).

Sheridon et al.; 10.2/9:25 A.M.: A Photoconductor–Addressed Electrophoretic Cell for Office Data Display; Jan. 1, 1982; 94–95; SID 82 Digest.

Shiffman et al.; An Electrophoretic Image Display with Internal NMOS Address Logic and Display Drivers; Jan. 1, 1984; 105–15; Proceedings of the SID; 25(2).

Shimoda et al.; 26.3: Multicolor Pixel Patterning of Light–Emitting Polymers by Ink–Jet Printing; May 18, 1999; 376–79; Society for Information Display International Symposium Digest of Technical Papers; 30.

Shiwa et al.; 5.6: Electrophoretic Display Method Using Ionographic Technology; Jan. 1, 1988; 61–62; SID 88 Digest.

Singer et al.; An X–Y Addressable Electrophoretic Display; Jul. 1, 1977; 255–66; Proceeding of the S.I.D.

Sirringhaus, H et al.; Integrated Optoelectronic Devices Based on Conjugated Polymers; Jun. 12, 1998; 1741–1744; Science; 280.

Torsi et al.; Organic Thin–Film–Transistors with High on–off Ratios; Jan. 1, 1995; 695–700; Materials Research Society Symp. Proc.; 377.

Toyama et al.; P–43: An Electrophoretic Matrix Display with External Logic and Driver Directly Assembled to the Panel; Jan. 1, 1994; 588–90; SID 1994 Digest.

Vance, D.W.; Optical Characteristics of Electrophoretic Displays; Jul. 1, 1997; 267–74; Proceeding of the S.I.D.; 18(3,4).

Vaz et al.; Dual Frequency Addressing of Polymer–Dispensed Liquid–Crystal Films; Jun. 15, 1989; 5043–49; Journal of Applied Physics; 65(12).

Webber, R. M.; 10.4: Image Stability in Active–Matrix Microencapsulated Electrophoretic Displays; Jan. 1, 2002; 126–129; SID 02 Digest.

White, R; An Electrophoretic Bar Graph Display; Jan. 1, 1981; 173–80; Proceedings of the SID; 22/3.

Yamaguchi et al.; Equivalent Circuit of Ion Projection–Driven Electrophoretic Display; Dec. 1, 1991; 4152–56; IEICE Transaction; 74(12).

Yamaguchi, Yoshiro; Toner Display Using Insulative Particles Charged Triboelectrically; Oct. 22, 2001; 1729–30; Asia Display/IDW '01; AMD4–4 (Late–News Paper).

Yang, K.H.; The Investigation of Image Formation in a Large–Area Solid State X–Ray Receptor with Electrophoretic Display; Sep. 1, 1983; 4711–21; Journal of Applied Physics; 54(9).

* cited by examiner

ELECTRO-OPTIC DISPLAY OVERLAYS AND SYSTEMS FOR ADDRESSING SUCH DISPLAYS

CROSS-REFERENCE TO RELATED APPLICATIONS

The present application is a continuation in part of U.S. Ser. No. 09/272,716 filed on Mar. 18, 1999, now U.S. Pat. No. 6,445,489, which itself claims the benefit of U.S. provisional patent application serial No. 60/078,363, filed Mar. 18, 1998 and U.S. provisional patent application serial No. 60/090,232, filed Jun. 22, 1998, the disclosures of which are hereby incorporated by reference.

FIELD OF THE INVENTION

The present invention relates to electro-optic displays and systems for addressing such displays and, in particular, to electro-optic display overlays.

BACKGROUND OF THE INVENTION

Many types of emissive displays exist and there are many methods of fabricating emissive displays. However, most emissive displays suffer from poor contrast, viewing angle restrictions, and constant power requirements. For example, liquid crystal displays (LCD's), which are commonly used in screens for laptop computers and other consumer electronic devices, suffer from both viewing angle restrictions, meaning that these displays can only be viewed from a few physical positions constrained by the viewing axis of the display, and limited favorable light conditions. Thus, the usefulness of emissive LCD displays is typically limited. For example, use of emissive LCD displays in high light situations (such as outdoor use) is generally impractical.

Further, nearly all emissive display require a constant supply of power to operate. This power requirement makes emissive displays challenging to incorporate in devices that do not have a connection to a constant supply of power or that have a connection only to a limited power supply such as batteries.

It is desirable to provide a display overlay that improves contrast and viewing angle for an emissive display while, at the same time, reducing power consumption.

SUMMARY OF THE INVENTION

The display overlays described later improve the contrast and remedy the viewing angle restrictions present in emissive displays as they exist today. Such display overlays will increase the usefulness of current day emissive displays and enable them to be used in more numerous situations, including high light situations. It is desirable that such display overlays improve the life and power efficiency of emissive displays. The display overlays may be added to existing emissive displays or, in other embodiments, may be designed as an integral part of emissive displays. Display overlays of the invention may be flexible. The display overlay materials may, for example, be printed onto thin, flexible substrates. Such substrates may include pliable, plastics, polymeric films, metal foils, and thin glass, for example.

Reflective electro-optic display overlays, especially encapsulated electro-optic display overlays, and systems including modules for addressing such display overlays may improve the usefulness and lifetime of present day emissive displays. Preferable systems of the invention avoid the high costs associated with using direct drive and active matrix drive addressing schemes by allowing for the addressing of display media that have poor threshold behavior. The display overlay of the invention improves the viewing angle restrictions and performance of the display in bright conditions by converting the emissive display to a reflective display. An emissive display includes emissive material (i.e., a light system that generates a pattern of light).

There are a number of interesting reflective display media which provide good optical appearance and the ability to be easily constructed in large areas or on flexible substrates at low cost. Such display media may be employed in displays and display overlays in accordance with the present invention. Suitable display media include microencapsulated electro-optic displays, electrochromic displays, rotating bichromal ball displays, suspended particle displays, and composites of liquid crystals with polymers, including polymer dispersed liquid crystals, polymer stabilized liquid crystals, and liquid crystal gels.

In one aspect of the invention, a display overlay is a reflective electro-optic display in optical communication with an emissive display. The display overlay also includes a photoconductive layer that is adjacent an electro-optic layer and a means for applying an electric field across the electro-optic layer (which may hereinafter be referred to as the "contrast media" layer). An electro-optic layer may be a reflective electrophoretic layer. In one embodiment, the means for applying an electric field includes an electrostatic charge deposited on at least one of the electro-optic layer or the photoconductive layer. In a second embodiment, the means for applying an electric field includes a first electrode and a second electrode. The display overlay includes a synchronization module that receives signals indicative of an emissive display output and controls the application of an electric field to the display overlay in response to the signals received by the synchronization module. In one embodiment, the synchronization module controls application of light to the display overlay.

In some embodiments, the first electrode is adjacent the first side of the photoconductive layer, and the second electrode is adjacent the contrast media layer. One or more electrode of the display overlay may be light-transmissive, transparent, or translucent. The electrodes may be formed from indium tin oxide (ITO). In a particular embodiment, the electrode on the rear side of the display overlay is translucent. In another embodiment, the electrode on the rear side of the display overlay is light-transmissive. In yet another embodiment, the electrode on the rear side of the display overlay is transparent. Light from the light source travels through the rear electrode to strike the photoconductive layer. When the display overlay is exposed to an emission, such as light generated from a light source, the pattern of light reduces impedance in the photoconductive layer. The reduced impedance permits an applied electric field to address the contrast media layer. In one embodiment, the electro-optic display visual appearance is substantially similar to the visual appearance of the emissive display. In another particular embodiment, the electrode on the front side of the display overlay is translucent; a translucent front electrode may enhance viewability of the electro-optic display visual appearance. In one embodiment, the electrode on the front side of the display overlay is transparent; a transparent front electrode may also enhance viewability of the electro-optic display visual appearance. In another embodiment, the electrode on the front side of the display overlay is light-transmissive; a light-transmissive front electrode may similarly enhance viewability of the electro-optic display visual appearance. The display may include, for example, a first protective layer adjacent the first electrode and a second protective layer adjacent the second electrode.

The display overlay may be placed adjacent, or overlay, an emissive display. The emissive display may include, for example, a cathode ray tube, LCD or other emissive display such as an electroluminescent display. Alternatively, the display overlay may be integral with the emissive display.

In some embodiments the display overlay synchronization module receives signals indicative of emissive display output. Responsive to the received signals, the synchronization module controls the first and second electrodes to apply an electric field to the contrast media layer. In a first embodiment, the synchronization module controls the first and second electrode via a universal serial bus (USB). In a second embodiment, the synchronization module controls the first and second electrodes via a serial cable. In another embodiment, the synchronization module controls the first and second electrodes via an optical interface. The synchronization module may include, for example, a device driver, a thread, or WINDOWS sub-system. In other embodiments the synchronization module may be special-purpose hardware such as appropriately configured programmable logic devices (PLDs), field-programmable gate arrays (FPGAs), or application-specific integrated circuits (ASICs).

In other embodiments, the display overlay has one or more optical barrier layers. The optical barrier layers may be placed between a second side of the photoconductive layer and the contrast media layer. Such an optical barrier layer may prevent unwanted addressing of the display overlay caused by light from, for example, the side of the display overlay from which the image is to be viewed from reducing the impedance of the photoconductive layer of the display overlay. Although the electro-optic layer used in the present invention is reflective, several types of reflective electro-optic materials do allow a small proportion of the light incident upon them to leak through, and even a small amount of such leakage could adversely affect the operation of the present overlay. For example, consider a situation in which an overlay of the present invention is being used to enable a back-lit LCD to be read easily in bright sunlight. Under such conditions, the sunlight incident upon the viewing surface of the overlay could easily be 50 times as bright as the LCD, so that leakage of, for example, 2 percent of this incident sunlight through the electro-optic layer would expose the photoconductor to light as bright as that of the LCD, essentially destroying the ability of the overlay to reproduce the image on the LCD. Alternatively or in addition, the optical barrier layer may be employed to selectively mask the display to prevent the impedance of the photoconductive layer from being reduced, thus preventing the areas where the "masking" optical barrier layer is present from being addressed. The optical barrier layer may include a conductive material.

The optical barrier layer may have anisotropic conductivity, with the conductivity through the thickness of the barrier layer being substantially greater than its conductivity laterally within the barrier layer. It will be appreciated that current passing through the photoconductor layer will tend to spread out laterally as it passes through the barrier layer, and this spreading of current causes "blooming" of light-emitting areas of the emissive display, i.e., the reproduction on the contrast medium layer of a light-emitting area of the emissive display will be slightly larger than that of the original area, the difference in size being governed by the lateral spreading of current within the photoconductor layer. Such blooming is undesirable since it produces distortion of the image seen on the overlay. By using a barrier layer with anisotropic conductivity, the current spreading, and hence the blooming problem, can be minimized. Suitable barrier layers with anisotropic conductivity may comprises small metal filaments or threads oriented in one direction within a polymeric matrix; such materials are available commercially, often being referred to as "z-axis conductors".

In still other embodiments, the contrast media layer of the display overlay has at least one capsule containing a suspending fluid and a particle. In other embodiments the electro-optic layer comprises a polymeric substrate defining a plurality of cells that contain a suspending fluid and a particle. In these embodiments, the suspending fluid may include a first optical property and the particle may include a second optical property. When an electric field is applied to the electro-optic layer, the capsule changes visual states responsive to the optical properties of the suspending fluid and the particle. The particle may be, for example, substantially white, black, or red. The suspending fluid may be, for example, substantially transparent or substantially black.

In another embodiment, at least one capsule or cell in the electro-optic layer contains a first particle and a second particle. The first particle may have a first optical property and the second particle may have a second optical property. An electric field applied to the electro-optic layer causes the capsule to change visual state in response to the first and second optical properties of the first and second particles. In one embodiment where the capsule or cell contains a first particle and a second particle, at least one particle is substantially white or at least one particle is black. The capsule or cell may contain, for example, at least one red particle, at least one blue particle, and at least one green particle.

In some embodiments the photoconductive layer comprises material selected from, for example, organic photoconductive polymers, dye aggregate photoreceptors, and pigment-based photoconductors. In one particular embodiment, the photoconductive layer includes 2,4,7-trinitro-9-fluorenone complexed with poly(N-vinylcarbazole).

In another aspect, the invention provides a method of controlling a reflective display to have a visual appearance substantially similar to an emissive display. The reflective display includes an electro-optic layer adjacent a photoconductive layer. The photoconductive layer provides impedance. The reflective display includes a first electrode adjacent a first side of the photoconductive layer and a second electrode that is adjacent the electro-optic layer. According to the method, signals are received from the emissive display and the first and second electrodes are controlled to apply an electric field to the contrast media layer in response to the received signals. In one embodiment, the synchronization module controls the first and second electrodes to apply an electric field to the contrast media layer for the duration of time required for the contrast media layer to respond. A control signal may be transmitted to the first and second electrode via a USB.

In one embodiment, the emissive display output is a pattern of light displayed by the emissive display. The light pattern decreases the impedance of the photoconductive layer and an electric field is applied, addressing the contrast media layer. In some embodiments, the pattern of light and resulting display on the reflective display overlay is responsive to the emissive display output.

In yet another aspect, the invention is an article of manufacture for controlling a reflective display to have a visual appearance that is substantially similar to an emissive display. The reflective display includes a contrast media layer adjacent to a photoconductive layer. A first electrode is adjacent a first side of the photoconductive layer and a second layer is adjacent the contrast media layer. The article of manufacture comprises a computer-readable program means for receiving signals indicative of output from the emissive display. The article of manufacture also comprises a computer-readable program means for controlling the first and second electrodes to apply an electric field to the contrast media layer in response to the received signals. In one embodiment, the computer-readable program means transmits a control signal to the first and second electrodes via a USB. In another embodiment, the control signal is a "timing signal" that controls the first electrode and the second electrode to provide an electric field to the contrast media layer for the time required for the contrast media layer to respond. In one embodiment, the control signal controls the first and the second electrode to provide an electric field for the time required to reset, i.e., "blacken" or "blank", the display overlay. In another embodiment, the control signal controls the first and the second electrode to provide an electric field for the time required to address the image of the emissive display on the reflective display. In one embodiment, when the control signal remains idle the reset image may be visible. In another embodiment, when the control signal remains idle the addressed image may be visible.

The advantages of the invention described above, as well as further advantages of the invention, will be understood further upon consideration of the following drawings, description, and claims.

BRIEF DESCRIPTION OF THE DRAWINGS

The drawings referred to below are not necessarily to scale, emphasis being placed primarily on illustrating the described invention. Like reference characters in different drawings represent corresponding parts.

DETAILED DESCRIPTION OF THE INVENTION

Figure 1:
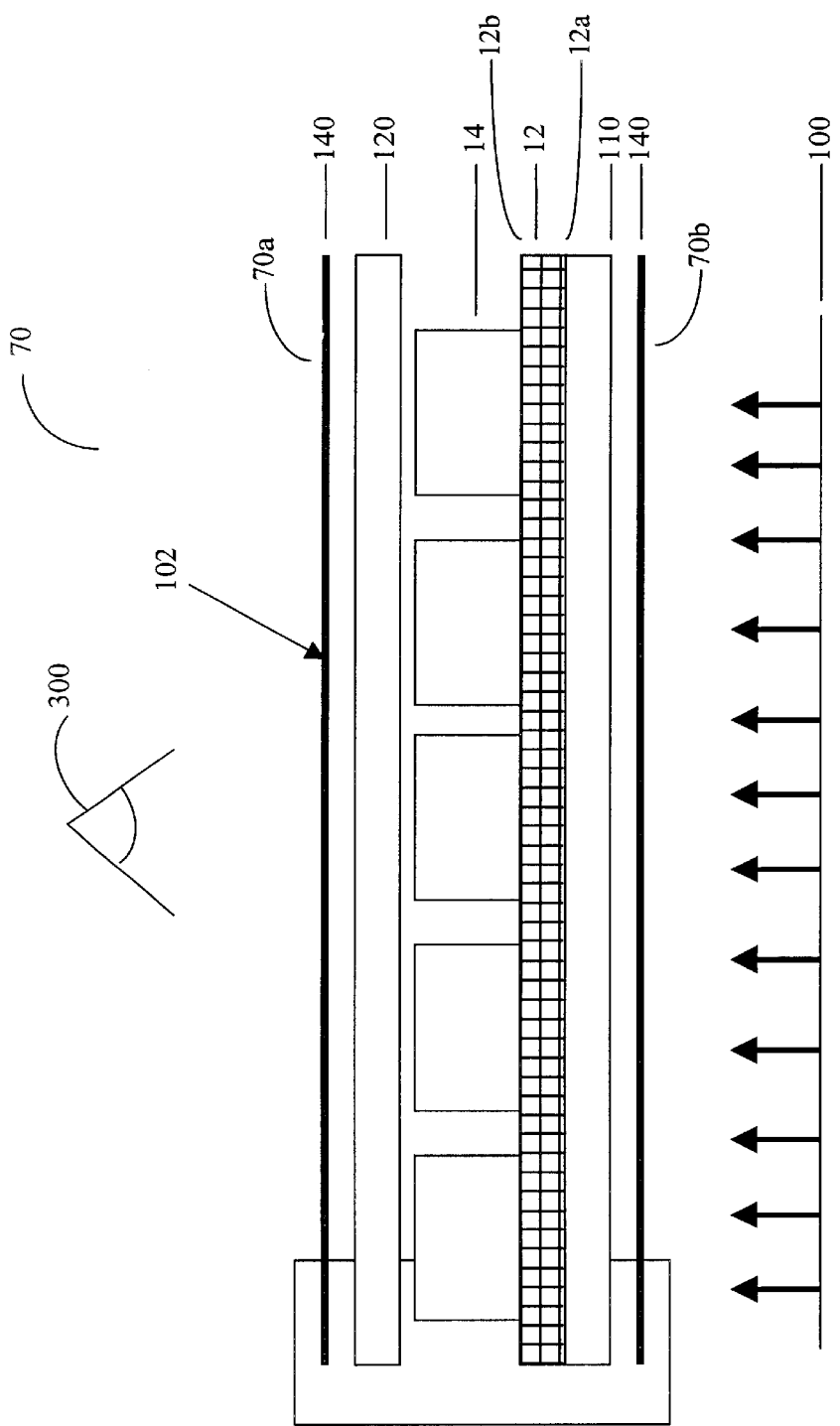
FIG. 1 is a cross-sectional view of an embodiment of a display featuring a contrast media layer, a photoconductive layer, and two electrodes.

Referring now to FIG. 1, and in brief overview, one embodiment of a display overlay 70 constructed in accordance with the present invention includes a photoconductive layer 12, a contrast media layer 14, a first electrode 110 and a second electrode 120. The display overlay 70 has a front, or viewing, side 70a and a rear side 70b. The photoconductive layer 12 has a first side 12a and a second side 12b. Although not required in all embodiments, the embodiment shown in FIG. 1 includes protective layers 140 adjacent the electrodes 110, 120.

Exposing the photoconductive layer 12 to light 100 reduces its impedance, permitting an electric field applied by electrodes 110 and 120 to address the contrast media layer 14. Photoconductive materials useful as the photoconductive layer 12 of display overlay 70 include organic photoconductive polymers, dye-aggregate photoreceptors, and pigment-based photoconductors. In some embodiments of the invention, it may be advantageous to construct a two-layer photoconductive material in which the charge-generation and charge-transport layers are separate (i.e., a dual-layer configuration). Photoconductive materials for use in display overlays of the invention are preferably organic photoconductive polymers. An example of an organic photoconductive polymer is 2,4,7-trinitro-9-fluorenone complexed with poly(N-vinylcarbazole). For pigment-based photoconductors, the pigment particles themselves may be photoconductive, so that the photoactive and optically active components are the same.

Examples of other photoconductive materials from which the photoconductive layer 12 may be formed include inorganic and organic photoconductive materials, layered photoconductive materials having inorganic or organic compositions, and composite layered devices containing photoconductive materials in a polymer matrix. Exemplary photoconductive materials include, for example, an inorganic photoconductive composition or an organic photoconductive composition dispersed in a resinous binder material such as, for example, a poly(hydroxyether) material. One example of a composite layered device is a dispersion of zinc oxide particles in a polymer matrix. Useful polymer matrices include those that are incapable of transporting for any significant distance injected charge carriers generated by the photoconductive material. Such useful polymer matrices include, but are not limited to, polystyrene resins, silicone resins, acrylic and methacrylic ester polymers, polymerized ester derivatives of acrylic acids, α-acrylic acids and α-methacrylic acids, chlorinated rubber, vinyl polymers and copolymers, and cellulose esters.

Other known photoconductive materials which may be useful in the present invention include hydrogenated amorphous silicon, cadmium selenide, gallium arsenide, trigonal selenium, amorphous selenium, doped amorphous selenium substances, halogen doped amorphous selenium substances, amorphous selenium alloys, doped amorphous selenium alloys, including selenium arsenic, selenium tellurium, selenium arsenic antimony, halogen doped selenium alloys, wherein the dopant is a material such as chlorine, iodine, bromine, sodium or fluorine, cadmium sulfide, an alkali metal, and the like. Selenium alloys that may be used may comprise, for example, selenium-tellurium-arsenic; in one embodiment a halogen doped selenium arsenic alloy is employed. Other inorganic photoconductive materials may include, for example, cadmium sulfoselenide, cadmium selenide, and cadmium sulfide. The organic photoconductive composition may include, for example, a metal free phthalocyanine, a metal phthalocyanine, a charge transfer complex material, a squarilium dye, and a vanadyl phthalocyanine. Generally, these photoconductive materials are deposited on a suitable substrate, such as a glass, plastic, or polyester substrate.

Depending on their construction, photoconductive material sensitivities may be tuned into different portions of the infrared, visible, and ultraviolet spectrum. Photoconductive layer 12 is preferably formed from a material having an absorption activity that is substantially matched to the emissive wavelength range of the source of light 100. The wavelength sensitivity of the photoconductor is dependent on the composition of the charge generator. For example, if the charge generator is primarily selenium alloys, the photoconductive material is most sensitive to blue light near the 400 nm wavelength range. Alternatively, if the charge generator is mainly phthalocyanine pigments, the photoconductive material is most sensitive to red light near the 700 m wavelength range.

Contrast media layers 14 for use in displays and display overlays 70 of the invention may include any display media that is bistable. The definition of a bistable depends on the application for the display overlay 70. A slowly-decaying optical state can be effectively bistable if the optical state is substantially unchanged over the required viewing time. For example, in a display which is updated every few minutes, a display image which is stable for hours or days is effectively bistable for that application. In this invention, the term bistable also indicates a display with an optical state sufficiently long-lived as to be effectively bistable for the application in mind. In practice, some electro-optic displays are capable of achieving multiple gray states, and are stable not only in their extreme black and white optical states, but also in their intermediate gray states. Such displays may be described as "multi-stable". Examples of display media suitable for use include rotating bichromal spheres or cylinders, retroreflective liquids of differing dielectric constants (i.e., suspended liquid displays). The contrast media layer may also be a classic emissive, transmissive, or transflective display material or encapsulated electro-optic display media. In one embodiment, the encapsulated display media comprises a particle-based display medium. In one detailed embodiment, the particle-based display medium comprises an electronic ink. An electronic ink is an optoelectronically active material which comprises at least two phases: an electro-optic contrast medium phase and a coating/binding phase. The electro-optic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electro-optic phase is encapsulated, that is, there is a capsule wall phase between the two phases. The coating/binding phase includes, in one embodiment, a polymer matrix that surrounds the electro-optic phase. In this embodiment, the polymer in the polymeric binder is capable of being dried, crosslinked, or otherwise cured as in traditional inks, and therefore a printing process can be used to deposit the electronic ink onto a substrate. In some other embodiments, the electro-optic material is dispersed within one or more wells defined by the polymer matrix. According to this embodiment, the polymer matrix defines one or more wells that hold the electro-optic material. The wells may be formed by, for example, embossing, etching, punching, slitting stretching, stamping, extruding and injection molding the shape of the matrix onto the polymer material.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. As such, the conductive leads and electrodes used to deliver the voltage to electronic ink displays can be of relatively high resistivity. The ability to use resistive conductors substantially widens the number and type of materials that can be used as conductors in electronic ink displays.

An encapsulated electro-optic layer of the invention may comprise one or more capsules, each of which contains electrophoretic particles dispersed in a suspending fluid. In other embodiments, the electro-optic layer comprises a polymeric substrate, such as a plastic sheet, that defines one or more cavities, each of which contain electrophoretic particles dispersed in a suspending fluid. In some embodiments of the invention, at least one species of particles are titania particles or other particles of high refractive index such as clays. In other embodiments of the invention, at least one species of particles responds to heat, fluorescent light, magnetic field, or other phenomena, and releases light. In still other embodiments, each capsule or cavity contains more than one species of electrophoretic particle.

Useful materials for constructing encapsulated electro-optic displays are discussed in detail below. Many of these materials will be known to those skilled in the art of constructing conventional electro-optic displays, or those skilled in the art of microencapsulation. The combination of these materials and processes, along with the other necessary components found in an encapsulated electro-optic display, comprise the invention described herein.

A. Particles

There is much flexibility in the choice of particles for use in electro-optic displays, as described above. For purposes of this invention, a particle is any component that is charged or capable of acquiring a charge (i.e., has or is capable of acquiring electrophoretic mobility), and, in some cases, this mobility may be zero or close to zero (i.e., the particles will not move). The particles may be neat pigments, dyed (laked) pigments or pigment/polymer composites, or any other component that is charged or capable of acquiring a charge. Typical considerations for the electrophoretic particle are its optical properties, electrical properties, and surface chemistry. The particles may be organic or inorganic compounds, and they may either absorb light or scatter light. The particles for use in the invention may further include scattering pigments, absorbing pigments and luminescent particles. The particles may be retroreflective, such as corner cubes, or they may be electroluminescent, such as zinc sulfide particles, which emit light when excited by an AC field, or they may be photoluminescent. Finally, the particles may be surface treated so as to improve charging or interaction with a charging agent, or to improve dispersibility.

A preferred particle for use in electro-optic displays of the invention is titania. The titania particles may be coated with a metal oxide, such as aluminum oxide or silicon oxide, for example. The titania particles may have one, two, or more layers of metal-oxide coating. For example, a titania particle for use in electro-optic displays of the invention may have a coating of aluminum oxide and a coating of silicon oxide. The coatings may be added to the particle in any order.

The electrophoretic particle is usually a pigment, a polymer, a laked pigment, or some combination of the above. A neat pigment can be any pigment, and, usually for a light colored particle, pigments such as, for example, rutile (titania), anatase (titania), barium sulfate, kaolin, or zinc oxide are useful. Some typical particles have high refractive indices, high scattering coefficients, and low absorption coefficients. Other particles are absorptive, such as carbon black or colored pigments used in paints and inks. The pigment should also be insoluble in the suspending fluid. Yellow pigments such as diarylide yellow, hansa yellow, and benzidin yellow have also found use in similar displays. Any other reflective material can be employed for a light colored particle, including non-pigment materials, such as metallic particles.

Useful neat pigments include, but are not limited to, $PbCrO_4$, Cyan blue GT 55-3295 (American Cyanamid Company, Wayne, N.J.), Cibacron Black BG (Ciba Company, Inc., Newport, Del.), Cibacron Turquoise Blue G (Ciba), Cibalon Black BGL (Ciba), Orasol Black BRG (Ciba), Orasol Black RBL (Ciba), Acetamine Blac, CBS (E.I. du Pont de Nemours and Company, Inc., Wilmington, Del.), Crocein Scarlet N Ex (du Pont) (27290), Fiber Black VF (DuPont) (30235), Luxol Fast Black L (DuPont) (Solv. Black 17), Nirosine Base No. 424 (DuPont) (50415 B), Oil Black BG (DuPont) (Solv. Black 16), Rotalin Black RM (DuPont), Sevron Brilliant Red 3 B (DuPont); Basic Black DSC (Dye Specialties, Inc.), Hectolene Black (Dye Specialties, Inc.), Azosol Brilliant Blue B (GAF, Dyestuff and Chemical Division, Wayne, N.J.) (Solv. Blue 9), Azosol Brilliant Green BA (GAF) (Solv. Green 2), Azosol Fast Brilliant Red B (GAF), Azosol Fast Orange RA Conc. (GAF) (Solv. Orange 20), Azosol Fast Yellow GRA Conc. (GAF) (13900 A), Basic Black KMPA (GAF), Benzofix Black CW-CF (GAF) (35435), Cellitazol BNFV Ex Soluble CF (GAF) (Disp. Black 9), Celliton Fast Blue AF Ex Conc (GAF) (Disp. Blue 9), Cyper Black IA (GAF) (Basic Blk. 3), Diamine Black CAP Ex Conc (GAF) (30235), Diamond Black EAN Hi Con. CF (GAF) (15710), Diamond Black PBBA Ex (GAF) (16505); Direct Deep Black EA Ex CF (GAF) (30235), Hansa Yellow G (GAF) (11680); Indanthrene Black BBK Powd. (GAF) (59850), Indocarbon CLGS Conc. CF (GAF) (53295), Katigen Deep Black NND Hi Conc. CF (GAF) (15711), Rapidogen Black 3 G (GAF) (Azoic Blk. 4); Sulphone Cyanine Black BA-CF (GAF) (26370), Zambezi Black VD Ex Conc. (GAF) (30015); Rubanox Red CP-1495 (The Sherwin-Williams Company, Cleveland, Ohio) (15630); Raven 11 (Columbian Carbon Company, Atlanta, Ga.), (carbon black aggregates with a particle size of about 25 µm), Statex B-12 (Columbian Carbon Co.) (a furnace black of 33 µm average particle size), and chrome green.

Particles may also include laked, or dyed, pigments. Laked pigments are particles that have a dye precipitated on them or which are stained. Lakes are metal salts of readily soluble anionic dyes. These are dyes of azo, triphenylmethane or anthraquinone structure containing one or more sulphonic or carboxylic acid groupings. They are usually precipitated by a calcium, barium or aluminum salt onto a substrate. Typical examples are peacock blue lake (CI Pigment Blue 24) and Persian orange (lake of CI Acid Orange 7), Black M Toner (GAF) (a mixture of carbon black and black dye precipitated on a lake).

A dark particle of the dyed type may be constructed from any light absorbing material, such as carbon black, or inorganic black materials. The dark material may also be selectively absorbing. For example, a dark green pigment may be used. Black particles may also be formed by staining latices with metal oxides, such latex copolymers consisting of any of butadiene, styrene, isoprene, methacrylic acid, methyl methacrylate, acrylonitrile, vinyl chloride, acrylic acid, sodium styrene sulfonate, vinyl acetate, chlorostyrene, dimethylaminopropylmethacrylamide, isocyanoethyl methacrylate and N-(isobutoxymethacrylamide), and optionally including conjugated diene compounds such as diacrylate, triacrylate, dimethylacrylate and trimethacrylate. Black particles may also be formed by a dispersion polymerization technique.

In the systems containing pigments and polymers, the pigments and polymers may form multiple domains within the electrophoretic particle, or be aggregates of smaller pigment/polymer combined particles. Alternatively, a central pigment core may be surrounded by a polymer shell. The pigment, polymer, or both can contain a dye. The optical purpose of the particle may be to scatter light, absorb light, or both. Useful sizes may range from 1 nm up to about 100 µm, as long as the particles are smaller than the bounding capsule. In a preferred embodiment, the density of the electrophoretic particle may be substantially matched to that of the suspending (i.e., electrophoretic) fluid. As defined herein, a suspending fluid has a density that is "substantially matched" to the density of the particle if the difference in their respective densities is between about zero and about two g/ml. This difference is preferably between about zero and about 0.5 g/ml.

Useful polymers for the particles include, but are not limited to: polystyrene, polyethylene, polypropylene, phenolic resins, Du Pont Elvax resins (ethylene-vinyl acetate copolymers), polyesters, polyacrylates, polymethacrylates, ethylene acrylic acid or methacrylic acid copolymers (Nucrel Resins—DuPont, Primacor Resins—Dow Chemical), acrylic copolymers and terpolymers (Elvacite Resins, DuPont) and PMMA. Useful materials for homopolymer/pigment phase separation in high shear melt include, but are not limited to, polyethylene, polypropylene, polymethylmethacrylate, polyisobutylmethacrylate, polystyrene, polybutadiene, polyisoprene, polyisobutylene, polylauryl methacrylate, polystearyl methacrylate, polyisobornyl methacrylate, poly-t-butyl methacrylate, polyethyl methacrylate, polymethyl acrylate, polyethyl acrylate, polyacrylonitrile, and copolymers of two or more of these materials. Some useful pigment/polymer complexes that are commercially available include, but are not limited to, Process Magenta PM 1776 (Magruder Color Company, Inc., Elizabeth, N.J.), Methyl Violet PMA VM6223 (Magruder Color Company, Inc., Elizabeth, N.J.), and Naphthol FGR RF6257 (Magruder Color Company, Inc., Elizabeth, N.J.).

The pigment-polymer composite may be formed by a physical process, (e.g., attrition or ball milling), a chemical process (e.g., microencapsulation or dispersion polymerization), or any other process known in the art of particle production. From the following non-limiting examples, it may be seen that the processes and materials for both the fabrication of particles and the charging thereof are generally derived from the art of liquid toner, or liquid immersion development. Thus any of the known processes from liquid development are particularly, but not exclusively, relevant.

New and useful electro-optic particles may still be discovered, but a number of particles already known to those skilled in the art of electro-optic displays and liquid toners can also prove useful. In general, the polymer requirements for liquid toners and encapsulated electro-optic inks are similar, in that the pigment or dye must be easily incorporated therein, either by a physical, chemical, or physico-chemical process, may aid in the colloidal stability, and may contain charging sites or may be able to incorporate materials which contain charging sites. One general requirement from the liquid toner industry that is not shared by encapsulated electro-optic inks is that the toner must be capable of "fixing" the image, i.e., heat fusing together to create a uniform film after the deposition of the toner particles.

Typical manufacturing techniques for particles are drawn from the liquid toner and other arts and include ball milling, attrition, jet milling, etc. The process will be illustrated for the case of a pigmented polymeric particle. In such a case the pigment is compounded in the polymer, usually in some kind of high shear mechanism such as a screw extruder. The composite material is then (wet or dry) ground to a starting size of around 10 μm. It is then dispersed in a carrier liquid, for example ISOPAR® (Exxon, Houston, Tex.), optionally with some charge control agent(s), and milled under high shear for several hours down to a final particle size and/or size distribution.

Another manufacturing technique for particles drawn from the liquid toner field is to add the polymer, pigment, and suspending fluid to a media mill. The mill is started and simultaneously heated to temperature at which the polymer swells substantially with the solvent. This temperature is typically near 100° C. In this state, the pigment is easily encapsulated into the swollen polymer. After a suitable time, typically a few hours, the mill is gradually cooled back to ambient temperature while stirring. The milling may be continued for some time to achieve a small enough particle size, typically a few microns in diameter. The charging agents may be added at this time. Optionally, more suspending fluid may be added.

Chemical processes such as dispersion polymerization, mini- or micro-emulsion polymerization, suspension polymerization precipitation, phase separation, solvent evaporation, in situ polymerization, seeded emulsion polymerization, or any process which falls under the general category of microencapsulation may be used. A typical process of this type is a phase separation process wherein a dissolved polymeric material is precipitated out of solution onto a dispersed pigment surface through solvent dilution, evaporation, or a thermal change. Other processes include chemical means for staining polymeric latices, for example with metal oxides or dyes.

B. Suspending Fluid

The suspending fluid containing the particles can be chosen based on properties such as density, refractive index, and solubility. A preferred suspending fluid has a low dielectric constant (about 2), high volume resistivity (about $10^{15}$ ohm-cm), low viscosity (less than 5 cst), low toxicity and environmental impact, low water solubility (less than 10 ppm), high specific gravity (greater than 1.5), a high boiling point (greater than 90° C.), and a low refractive index (less than 1.2).

The choice of suspending fluid may be based on concerns of chemical inertness, density matching to the electro-optic particle, or chemical compatibility with both the electro-optic particle and bounding capsule. The viscosity of the fluid should be low when you want the particles to move. The refractive index of the suspending fluid may also be substantially matched to that of the particles. As used herein, the refractive index of a suspending fluid "is substantially matched" to that of a particle if the difference between their respective refractive indices is between about zero and about 0.3, and is preferably between about 0.05 and about 0.2.

Additionally, the fluid may be chosen to be a poor solvent for some polymers, which is advantageous for use in the fabrication of microparticles because it increases the range of polymeric materials useful in fabricating particles of polymers and pigments. Organic solvents, such as halogenated organic solvents, saturated linear or branched hydrocarbons, silicone oils, and low molecular weight halogen-containing polymers are some useful suspending fluids. The suspending fluid may comprise a single fluid. The fluid will, however, often be a blend of more than one fluid in order to tune its chemical and physical properties. Furthermore, the fluid may contain surface modifiers to modify the surface energy or charge of the electro-optic particle or bounding capsule. Reactants or solvents for the microencapsulation process (oil soluble monomers, for example) can also be contained in the suspending fluid. Charge control agents can also be added to the suspending fluid.

Useful organic solvents include, but are not limited to, epoxides, such as, for example, decane epoxide and dodecane epoxide; vinyl ethers, such as, for example, cyclohexyl vinyl ether and Decave® (International Flavors & Fragrances, Inc., New York, N.Y.); and aromatic hydrocarbons, such as, for example, toluene and naphthalene. Useful halogenated organic solvents include, but are not limited to, tetrafluorodibromoethylene, tetrachloroethylene, trifluorochloroethylene, 1,2,4-trichlorobenzene, carbon tetrachloride. These materials have high densities. Useful hydrocarbons include, but are not limited to, dodecane, tetradecane, the aliphatic hydrocarbons in the Isopar® series (Exxon, Houston, Tex.), Norpar® (series of normal paraffinic liquids), Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly (methyl phenyl siloxane), hexamethyldisiloxane, and polydimethylsiloxane. These materials usually have low densities. Useful low molecular weight halogen-containing polymers include, but are not limited to, poly(chlorotrifluoroethylene) polymer (Halogenated hydrocarbon Inc., River Edge, N.J.), Galden®

(a perfluorinated ether from Ausimont, Morristown, N.J.), or Krytox® from DuPont (Wilmington, Del.). In a preferred embodiment, the suspending fluid is a poly (chlorotrifluoroethylene) polymer. In a particularly preferred embodiment, this polymer has a degree of polymerization from about 2 to about 10. Many of the above materials are available in a range of viscosities, densities, and boiling points.

The fluid must be capable of being formed into small droplets prior to a capsule being formed. Processes for forming small droplets include flow-through jets, membranes, nozzles, or orifices, as well as shear-based emulsifying schemes. The formation of small drops may be assisted by electrical or sonic fields. Surfactants and polymers can be used to aid in the stabilization and emulsification of the droplets in the case of an emulsion type encapsulation. A preferred surfactant for use in displays of the invention is sodium dodecylsulfate.

It can be advantageous in some displays for the suspending fluid to contain an optically absorbing dye. This dye must be soluble in the fluid, but will generally be insoluble in the other components of the capsule. There is much flexibility in the choice of dye material. The dye can be a pure compound, or blends of dyes to achieve a particular color, including black. The dyes can be fluorescent, which would produce a display in which the fluorescence properties depend on the position of the particles. The dyes can be photoactive, changing to another color or becoming colorless upon irradiation with either visible or ultraviolet light, providing another means for obtaining an optical response. Dyes could also be polymerizable, forming a solid absorbing polymer inside the bounding shell.

There are many dyes that can be chosen for use in encapsulated electro-optic display. Properties important here include light fastness, solubility in the suspending liquid, color, and cost. These are generally from the class of azo, anthraquinone, and triphenylmethane type dyes and may be chemically modified so as to increase the solubility in the oil phase and reduce the adsorption by the particle surface.

A number of dyes already known to those skilled in the art of electro-optic displays will prove useful. Useful azo dyes include, but are not limited to: the Oil Red dyes, and the Sudan Red and Sudan Black series of dyes. Useful anthraquinone dyes include, but are not limited to: the Oil Blue dyes, and the Macrolex Blue series of dyes. Useful triphenylmethane dyes include, but are not limited to, Michler's hydrol, Malachite Green, Crystal Violet, and Auramine O.

C. Charge Control Agents and Particle Stabilizers

Charge control agents are used to provide good electro-optic mobility to the electro-optic particles. Stabilizers are used to prevent agglomeration of the electro-optic particles, as well as prevent the electro-optic particles from irreversibly depositing onto the capsule wall. Either component can be constructed from materials across a wide range of molecular weights (low molecular weight, oligomeric, or polymeric), and may be pure or a mixture. In particular, suitable charge control agents are generally adapted from the liquid toner art. The charge control agent used to modify and/or stabilize the particle surface charge is applied as generally known in the arts of liquid toners, electro-optic displays, non-aqueous paint dispersions, and engine-oil additives. In all of these arts, charging species may be added to non-aqueous media in order to increase electro-optic mobility or increase electrostatic stabilization. The materials can improve steric stabilization as well. Different theories of charging are postulated, including selective ion adsorption, proton transfer, and contact electrification.

An optional charge control agent or charge director may be used. These constituents typically consist of low molecular weight surfactants, polymeric agents, or blends of one or more components and serve to stabilize or otherwise modify the sign and/or magnitude of the charge on the electro-optic particles. The charging properties of the pigment itself may be accounted for by taking into account the acidic or basic surface properties of the pigment, or the charging sites may take place on the carrier resin surface (if present), or a combination of the two.

Additional pigment properties which may be relevant are the particle size distribution, the chemical composition, and the lightfastness. The charge control agent used to modify and/or stabilize the particle surface charge is applied as generally known in the arts of liquid toners, electro-optic displays, non-aqueous paint dispersions, and engine-oil additives. In all of these arts, charging species may be added to non-aqueous media in order to increase electro-optic mobility or increase electrostatic stabilization. The materials can improve steric stabilization as well. Different theories of charging are postulated, including selective ion adsorption, proton transfer, and contact electrification.

Charge adjuvants may also be added. These materials increase the effectiveness of the charge control agents or charge directors. The charge adjuvant may be a polyhydroxy compound or an aminoalcohol compound, which are preferably soluble in the suspending fluid in an amount of at least 2% by weight. Examples of polyhydroxy compounds which contain at least two hydroxyl groups include, but are not limited to, ethylene glycol, 2,4,7,9-tetramethyldecyne-4,7-diol, poly(propylene glycol), pentaethylene glycol, tripropylene glycol, triethylene glycol, glycerol, pentaerythritol, glycerol tris(12-hydroxystearate), propylene glycol monohydroxystearate, and ethylene glycol mono-hydroxystrearate. Examples of aminoalcohol compounds which contain at least one alcohol function and one amine function in the same molecule include, but are not limited to, triisopropanolamine, triethanolamine, ethanolamine, 3-amino-1-propanol, o-aminophenol, 5-amino-1-pentanol, and tetrakis(2-hydroxyethyl)ethylenediamine. The charge adjuvant is preferably present in the suspending fluid in an amount of about 1 to about 100 mg/g of the particle mass, and more preferably about 50 to about 200 mg/g.

The surface of the particle may also be chemically modified to aid dispersion, to improve surface charge, and to improve the stability of the dispersion, for example. Surface modifiers include organic siloxanes, organohalogen silanes and other functional silane coupling agents (Dow Corning® Z-6070, Z-6124, and 3 additive, Midland, Mich.); organic titanates and zirconates (Tyzor® TOT, TBT, and TE Series, DuPont, Wilmington, Del.); hydrophobing agents, such as long chain (C12 to C50) alkyl and alkyl benzene sulphonic acids, fatty amines or diamines and their salts or quaternary derivatives; and amphipathic polymers which can be covalently bonded to the particle surface.

In general, it is believed that charging results as an acid-base reaction between some moiety present in the continuous phase and the particle surface. Thus useful materials are those which are capable of participating in such a reaction, or any other charging reaction as known in the art.

Different non-limiting classes of charge control agents which are useful include organic sulfates or sulfonates, metal soaps, block or comb copolymers, organic amides, organic zwitterions, and organic phosphates and phosphonates. Useful organic sulfates and sulfonates include, but are not limited to, sodium bis(2-ethyl hexyl) sulfosuccinate, calcium dodecyl benzene sulfonate, calcium petroleum sulfonate, neutral or basic barium dinonylnaphthalene sulfonate, neutral or basic calcium dinonylnaphthalene sulfonate, dodecylbenzenesulfonic acid sodium salt, and ammonium lauryl sulphate. Useful metal soaps include, but are not limited to, basic or neutral barium petronate, calcium petronate, Co-, Ca-, Cu-, Mn-, Ni-, Zn-, and Fe-salts of naphthenic acid, Ba-, Al-, Zn-, Cu-, Pb-, and Fe-salts of stearic acid, divalent and trivalent metal carboxylates, such as aluminum tristearate, aluminum octoanate, lithium heptanoate, iron stearate, iron distearate, barium stearate, chromium stearate, magnesium octanoate, calcium stearate, iron naphthenate, and zinc naphthenate, Mn- and Zn-heptanoate, and Ba-, Al-, Co-, Mn-, and Zn-octanoate. Useful block or comb copolymers include, but are not limited to, AB diblock copolymers of (A) polymers of 2-(N,N)-dimethylaminoethyl methacrylate quaternized with methyl-p-toluenesulfonate and (B) poly-2-ethylhexyl methacrylate, and comb graft copolymers with oil soluble tails of poly (12-hydroxystearic acid) and having a molecular weight of about 1800, pendant on an oil-soluble anchor group of poly (methyl methacrylate-methacrylic acid). Useful organic amides include, but are not limited to, polyisobutylene succinimides such as OLOA 1200 and 3700, and N-vinyl pyrrolidone polymers. Useful organic zwitterions include, but are not limited to, lecithin. Useful organic phosphates and phosphonates include, but are not limited to, the sodium salts of phosphated mono- and di-glycerides with saturated and unsaturated acid substituents.

Particle dispersion stabilizers may be added to prevent particle flocculation or attachment to the capsule walls. For the typical high resistivity liquids used as suspending fluids in electro-optic displays, nonaqueous surfactants may be used. These include, but are not limited to, glycol ethers, acetylenic glycols, alkanolamides, sorbitol derivatives, alkyl amines, quaternary amines, imidazolines, dialkyl oxides, and sulfosuccinates.

D. Encapsulation

Liquids and particles can be encapsulated, for example, within a membrane or in a binder material. Moreover, there is a long and rich history to encapsulation, with numerous processes and polymers having proven useful in creating capsules. Encapsulation of the internal phase may be accomplished in a number of different ways. Numerous suitable procedures for microencapsulation are detailed in both *Microencapsulation, Processes and Applications*, (I. E. Vandegaer, ed.), Plenum Press, New York, N.Y. (1974) and Gutcho, *Microcapsules and Mircroencapsulation Techniques*, Nuyes Data Corp., Park Ridge, N.J. (1976). The processes fall into several general categories, all of which can be applied to the present invention: interfacial polymerization, in situ polymerization, physical processes, such as coextrusion and other phase separation processes, in-liquid curing, and simple/complex coacervation.

Numerous materials and processes should prove useful in formulating displays of the present invention. Useful materials for simple coacervation processes include, but are not limited to, gelatin, polyvinyl alcohol, polyvinyl acetate, and cellulosic derivatives, such as, for example, carboxymethylcellulose. Useful materials for complex coacervation processes include, but are not limited to, gelatin, acacia, carageenan, carboxymethylcellulose, hydrolyzed styrene anhydride copolymers, agar, alginate, casein, albumin, methyl vinyl ether co-maleic anhydride, and cellulose phthalate. Useful materials for phase separation processes include, but are not limited to, polystyrene, PMMA, polyethyl methacrylate, polybutyl methacrylate, ethyl cellulose, polyvinyl pyridine, and poly acrylonitrile. Useful materials for in situ polymerization processes include, but are not limited to, polyhydroxyamides, with aldehydes, melamine, or urea and formaldehyde; water-soluble oligomers of the condensate of melamine, or urea and formaldehyde; and vinyl monomers, such as, for example, styrene, MMA and acrylonitrile. Finally, useful materials for interfacial polymerization processes include, but are not limited to, diacyl chlorides, such as, for example, sebacoyl, adipoyl, and di- or poly-amines or alcohols, and isocyanates. Useful emulsion polymerization materials may include, but are not limited to, styrene, vinyl acetate, acrylic acid, butyl acrylate, t-butyl acrylate, methyl methacrylate, and butyl methacrylate.

Capsules produced may be dispersed into a curable carrier, resulting in an ink which may be printed or coated on large and arbitrarily shaped or curved surfaces using conventional printing and coating techniques.

In the context of the present invention, one skilled in the art will select an encapsulation procedure and wall material based on the desired capsule properties. These properties include the distribution of capsule radii; electrical, mechanical, diffusion, and optical properties of the capsule wall; and chemical compatibility with the internal phase of the capsule.

The capsule wall generally has a high electrical resistivity. Although it is possible to use walls with relatively low resistivities, this may limit performance in requiring relatively higher addressing voltages. The capsule wall should also be mechanically strong (although if the finished capsule powder is to be dispersed in a curable polymeric binder for coating, mechanical strength is not as critical). The capsule wall should generally not be porous. If, however, it is desired to use an encapsulation procedure that produces porous capsules, these can be overcoated in a post-processing step (i.e., a second encapsulation). Moreover, if the capsules are to be dispersed in a curable binder, the binder will serve to close the pores. The capsule walls should be optically clear. The wall material may, however, be chosen to match the refractive index of the internal phase of the capsule (i.e., the suspending fluid) or a binder in which the capsules are to be dispersed. For some applications (e.g., interposition between two fixed electrodes), monodispersed capsule radii are desirable.

An encapsulation procedure involves a polymerization between urea and formaldehyde in an aqueous phase of an oil/water emulsion in the presence of a negatively charged, carboxyl-substituted, linear hydrocarbon polyelectrolyte material. The resulting capsule wall is a urea/formaldehyde copolymer, which discretely encloses the internal phase. The capsule is clear, mechanically strong, and has good resistivity properties.

The related technique of in situ polymerization utilizes an oil/water emulsion, which is formed by dispersing the electro-optic composition (i.e., the dielectric liquid containing a suspension of the pigment particles) in an aqueous environment. The monomers polymerize to form a polymer with higher affinity for the internal phase than for the aqueous phase, thus condensing around the emulsified oily droplets. In one especially useful in situ polymerization processes, urea and formaldehyde condense in the presence of poly(acrylic acid) (See, e.g., U.S. Pat. No. 4,001,140). In other useful process, any of a variety of cross-linking agents borne in aqueous solution is deposited around microscopic oil droplets. Such cross-linking agents include aldehydes, especially formaldehyde, glyoxal, or glutaraldehyde; alum; zirconium salts; and poly isocyanates. The entire disclosures of the U.S. Pat. Nos. 4,001,140 and 4,273,672 are hereby incorporated by reference herein.

The coacervation approach also utilizes an oil/water emulsion. One or more colloids are coacervated (i.e., agglomerated) out of the aqueous phase and deposited as shells around the oily droplets through control of temperature, pH and/or relative concentrations, thereby creating the microcapsule. Materials suitable for coacervation include gelatins and gum arabic.

The interfacial polymerization approach relies on the presence of an oil-soluble monomer in the electro-optic composition, which once again is present as an emulsion in an aqueous phase. The monomers in the minute hydrophobic droplets react with a monomer introduced into the aqueous phase, polymerizing at the interface between the droplets and the surrounding aqueous medium and forming shells around the droplets. Although the resulting walls are relatively thin and may be permeable, this process does not require the elevated temperatures characteristic of some other processes, and therefore affords greater flexibility in temperatures characteristic of some other processes, and therefore affords greater flexibility in terms of choosing the dielectric liquid.

Coating aids can be used to improve the uniformity and quality of the coated or printed electro-optic ink material. Wetting agents are typically added to adjust the interfacial tension at the coating/substrate interface and to adjust the liquid/air surface tension. Wetting agents include, but are not limited to, anionic and cationic surfactants, and nonionic species, such as silicone or fluoropolymer based materials. Dispersing agents may be used to modify the interfacial tension between the capsules and binder, providing control over flocculation and particle settling.

Surface tension modifiers can be added to adjust the air/ink interfacial tension. Polysiloxanes are typically used in such an application to improve surface leveling while minimizing other defects within the coating. Surface tension modifiers include, but are not limited to, fluorinated surfactants, such as, for example, the Zonyl® series from DuPont (Wilmington, Del.), the Fluorod® series from 3M (St. Paul, Minn.), and the fluoroakyl series from Autochem (Glen Rock, N.J.); siloxanes, such as, for example, Silwet® from Union Carbide (Danbury, Conn.); and polyethoxy and polypropoxy alcohols. Antifoams, such as silicone and silicone-free polymeric materials, may be added to enhance the movement of air from within the ink to the surface and to facilitate the rupture of bubbles at the coating surface. Other useful antifoams include, but are not limited to, glyceryl esters, polyhydric alcohols, compounded antifoams, such as oil solutions of alkyl benzenes, natural fats, fatty acids, and metallic soaps, and silicone antifoaming agents made from the combination of dimethyl siloxane polymers and silica. Stabilizers such as uv-absorbers and antioxidants may also be added to improve the lifetime of the ink.

Other additives to control properties like coating viscosity and foaming can also be used in the coating fluid. Stabilizers (UV-absorbers, antioxidants) and other additives which could prove useful in practical materials.

E. Binder Material

The binder is used as a non-conducting, adhesive medium supporting and protecting the capsules, as well as binding the electrode materials to the capsule dispersion. Binders are available in many forms and chemical types. Among these are water-soluble polymers, water-borne polymers, oil-soluble polymers, thermoset and thermoplastic polymers, and radiation-cured polymers.

Among the water-soluble polymers are the various polysaccharides, the polyvinyl alcohols, N-methylpyrrolidone, N-vinylpyrrollidone, the various Carbowax® species (Union Carbide, Danbury, Conn.), and poly-2-hydroxyethylacrylate.

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a crosslinking reagent, such as an aziridine, for example, which reacts with carboxyl groups.

A typical application of a water-borne resin and aqueous capsules follows. A volume of particles is centrifuged at low speed to separate excess water. After a given centrifugation process, for example 10 minutes at 60×G, the capsules are found at the bottom of the centrifuge tube, while the water portion is at the top. The water portion is carefully removed (by decanting or pipetting). The mass of the remaining capsules is measured, and a mass of resin is added such that the mass of resin is between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the water-borne system, with the obvious exception of the water itself. The latitude in formulation for solvent systems is enormous, limited only by solvent choices and polymer solubility. Of considerable concern in solvent-based systems is the viability of the capsule itself—the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of very violet radiation, either long or short wavelength. As in all cases of curing polymer resins, final properties are determined by the branching and molecular weights of the monomers, oligomers and crosslinkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a medium and coated, provided the viscosity could be sufficiently lowered. Curing in such systems is generally by ultraviolet radiation. Still referring to FIG. 1, a first electrode 110 is disposed adjacent the first side 12a of the photoconductive layer 12 and a second electrode 120 is adjacent the contrast media layer 14. The first and second electrodes 110, 120 apply an electric field to the contrast media layer 14. In some embodiments, at least one of the electrodes 110, 120 is translucent, transparent, or light-transmissive. Such electrodes may be made of indium tin oxide (ITO) or a glass, plastic, or polyester substrate coated with ITO.

In some embodiments, either of both of the electrodes 110, 120 may be replaced by an alternative mechanism applying an electric field to the contrast media layer 14. For example, electrostatic charge may be deposited to one side of the contrast media layer 14, one side of the photoconductive layer 12 or both the contrast media layer 14 and the photoconductive layer 12 by movable electrodes that "wipe" charge onto the contrast media layer 14 or photoconductive layer 12. In still other embodiments a stylus-type addressing apparatus may be used to apply electrostatic charge to one side of the contrast media layer 14 or the photoconductive layer 12. Other methods for applying charge including the use of charge distributing devices such as corotrons and so-called "ion cannons." Alternatively, charged fluids may be distributed over the surfaces to be charged by applying an electrically charged fluid to a portion of at least one surface of the material to be charged. The charged fluid may be a gas, but is typically a liquid. Methods using a liquid charge carrier resemble a conventional ink jet printing process, except that the liquid carries electric charge to the material being addressed instead of a dye or pigment. Such methods can make use of prior art ink jet technology including technology that ensures that ink jet heads provide droplets of constant size. Methods for electrically charging small droplets are well developed. The same charging methods can be used to provide charged droplets for distribution over the surfaces to be charged. Thus according to this method charged droplets of constant size may be provided. Technology developed for precise positioning of the print head and print medium in conventional ink jet printers can be used for the distribution of charged fluid on the surfaces to be charged. The distribution of charged fluids over the surfaces to be charged is described in copending application Ser. No. 60/322,370, filed Sep. 14, 2001, which is hereby incorporated by reference herein. In still further embodiments, a first electrode is provided on one side of the photoconductive layer 12 and an electrostatic charge is deposited on one side of the contrast media layer 14.

A first electrode 110, allows light 100 to strike the photoconductive layer 12, reducing its impedance. With the photoconductive layer 12 impedance lowered, the first electrode 110 and the second electrode 120 apply an electric field to the contrast media layer 14 to address the contrast media layer 14, thereby updating the image displayed on the front portion 70a of display overlay 70. For embodiments in which the electrode 120 closest the front portion 70a comprises a transparent, translucent or light-transmissive material, the updated image is viewable.

Still referring to FIG. 1, one or more protective layers 140 may be disposed on the display overlay 70. One or both of the outermost layers of the front side 70a and the rear side 70b of the display overlay 70 may comprise a protective layer 140. Protective layers 140 are useful for embodiments in which one or more of the electrodes 110, 120 are replaced with an alternate means for applying electrostatic charge, as described above. In one embodiment, a protective layer 140 is adjacent the first electrode 110 and the second electrode 120 and the protective layers 140 are the outermost layers of the front side 70a and the rear side 70b of display overlay 70.

In some embodiments, the protective layer 140 is transparent. In other embodiments, the protective layer 140 is light-transmissive. In still other embodiments, the protective layer 140 is translucent. For example, the protective layer 140 may be made of plastic, or a polyester substrate. The photoconductive layer 12 may be visible from the rear side 70b of display overlay 70, through the protective layer 140 and a first electrode 110. Exposing the rear portion 70b of display overlay 70 to light 100 decreases the impedance of the photoconductive layer 12. The light 100 may be an emission from an emissive display. The light may also be, for example, a phosphor emission screen, a liquid crystal display, an emissive display made of a light-emitting material, such as an organic compound, an organometallic compound, an oligomer, or a polymer, or another emissive display known to one skilled in the art. Additionally, the emissive display may comprise, for example, an LCD or a cathode ray tube.

Furthermore, when the contrast media layer 14 is bistable, the display overlay 70 need only operate when the image on the emissive display is changed and is otherwise deactivated. During the period when the overlay 70 is operated, even a small amount of light from the emissive display is sufficient to activate certain photoconductive layers 12. Thus, the display operates with reduced power consumption and improved lifetime compared to a standalone emissive display. Also, of course, the present invention enables the emissive display to be used under conditions, such as in bright sunlight, where viewing an emissive display may be difficult or impossible. Finally, in this embodiment of the invention, favorable lower-voltage addressing characteristics of the display overlay 70 are utilized by the contrast media layer 14. The display overlay 70 therefore provides for the use of cheaper low-voltage drivers to address a high-voltage display.

Figure 2:
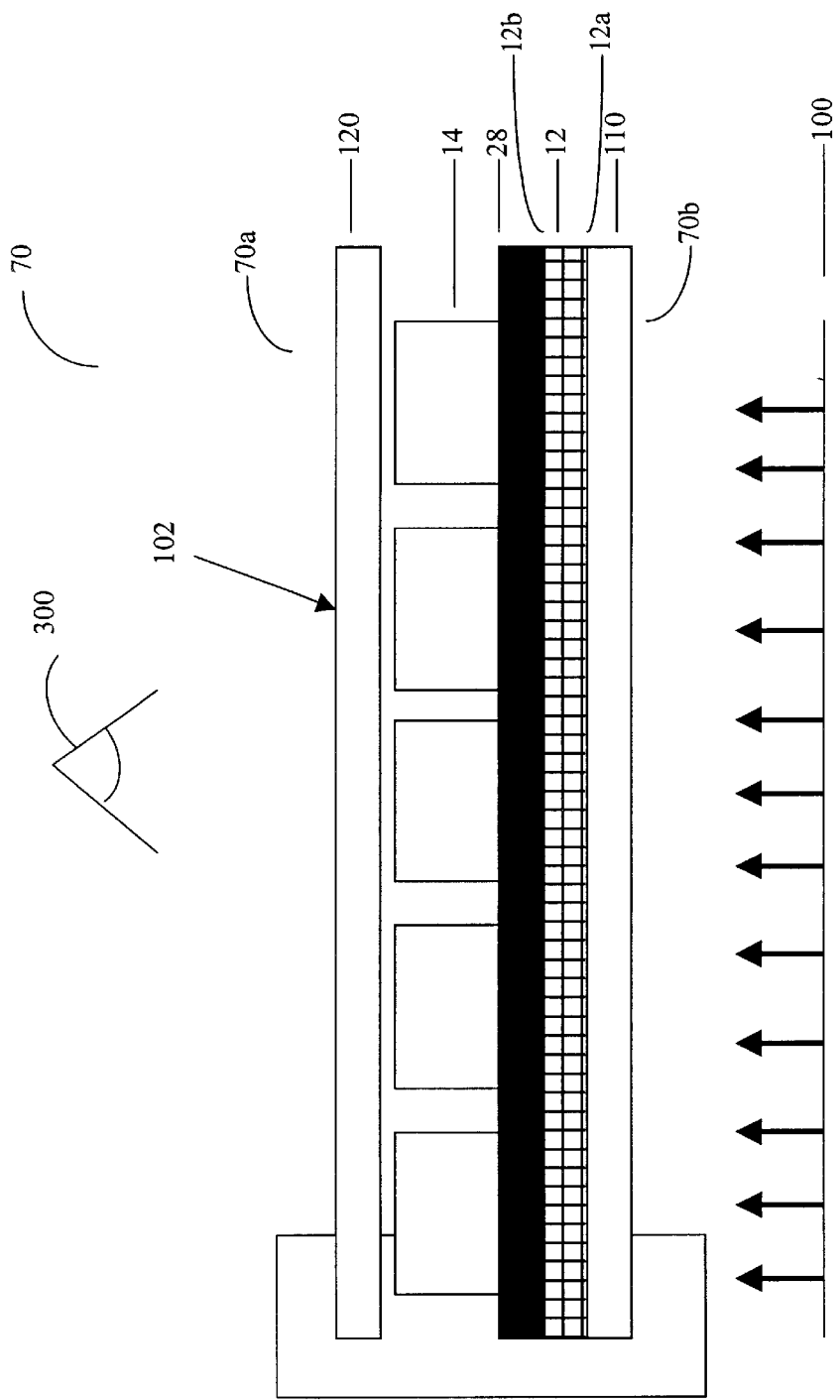
FIG. 2 is a cross-sectional view of an embodiment of a display overlay featuring an optical barrier layer between the contrast media layer and the photoconductive layer.

Referring now to FIG. 2, another embodiment of a display overlay 70 includes a photoconductive layer 12, a contrast media layer 14, a first electrode 110, a second electrode 120, and an optical barrier layer 28. In some embodiments, the display overlay 70 may include protective layers 140, as described above in connection with FIG. 1. In the embodiment shown in FIG. 2, an optical barrier layer 28 is disposed between the contrast media layer 14 and the photoconductive layer 12.

The optical barrier layer 28 may be employed to stop "dark currents" that occur in the photoconductive layer 12 due to leakage of light from the front surface 70a of the overlay 70 through the contrast media layer 14. Because many photoconductive materials are highly sensitive to light, even a small amount of incident light can lower this impedance sufficiently to allow the electrodes 110, 120 to address the contrast media layer 14. As used herein, "dark current" refers to this phenomena, i.e., unwanted addressing of the contrast media layer 14 due to light incident on the front surface 70a of the display overlay 70. The optical barrier layer 28 prevents light incident on the front surface 70a of the display overlay 70 from reaching the photoconductive layer 12. The optical barrier layer 28 may include a conductive material, which facilitates application of an electric field across the optical barrier layer 28 to address the contrast media layer 14.

In these embodiments, optical barrier layer 28 may be a dispersion of black pigment particles in an epoxy binder. The conductivity of the optical barrier layer 28 should be low enough to prevent significant lateral charge flow in the barrier layer. This may be accomplished by making the optical blocking layer 28 as thin as possible, of the order of a few microns. Alternatively, as discussed above, the barrier layer 28 may have anisotropic conductivity, with the conductivity through the thickness of the barrier layer being greater than the conductivity in the plane of the barrier layer.

In this embodiment, a pattern of light 100 incident on the rear side 70b of the display overlay 70 propagates through first electrode 110 and lowers the impedance of photoconductive layer 12. Electrodes 110, 120 apply an electric field to the contrast media layer 14 wherever the impedance of the photoconductive layer 12 is lowered. Light 102 that is incident on the front surface 70a of the display overlay 70 propagates through electrode 120 to strike the contrast media layer 14. Light reflected from the contrast media layer 14 forms the image viewed by an observer, therefore, it is desirable that all of the light 102 is reflected by the contrast media layer. However, any light that propagates through the contrast media layer is blocked by the barrier layer 28 before striking the photoconductive layer 12.

Figure 3:
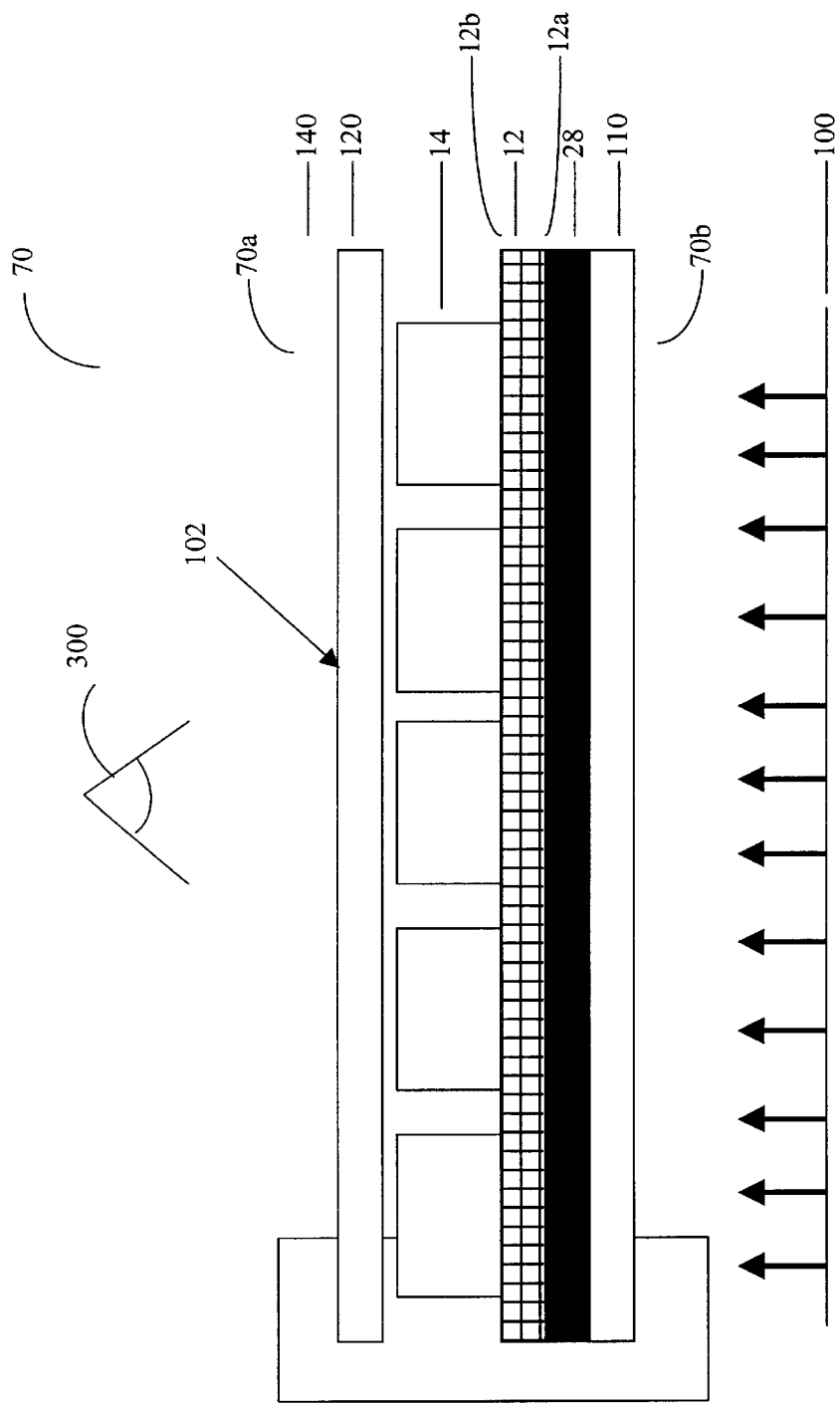
FIG. 3 is a cross-sectional view of an embodiment of a display overlay featuring an optical barrier layer between the photoconductive layer and an electrode.

FIG. 3 depicts another embodiment of a display overlay that includes a photoconductive layer 12, an contrast media layer 14, a first electrode 110, a second electrode 120, and an optical barrier layer 28 disposed between the first electrode 110 and the first side 12a of the photoconductive layer 12. In this embodiment the optical barrier layer 28 is patterned to selectively mask the first side 12a such that when the first side 12a is exposed to light 100, the impedance of the photoconductive layer 12 is not reduced where the optical barrier layer 28 is disposed. When the rear side 70b of display overlay 70 is exposed to light 100, the photoconductive layer 12 maintains its impedance at the points where the optical barrier layer 28 is present. Upon exposure to light 100, the impedance of the photoconductive layer 12 will decrease in the exposed portions of the photoconductive layer 12a, e.g., where the optical barrier layer 28 is absent. Thus, the voltage generated by the first electrode 110 and second electrode 120 is unable to address the contrast media layer 14 where the optical barrier layer 28 is present. The optical barrier layer 28 may be disposed to provide a desired region of the display overlay 70 that is capable of being updated, e.g., the optical barrier layer 28 may provide a region on the display overlay where the optical barrier is not present that is in the form of a shape such as, for example, a rectangle.

Figure 4A:
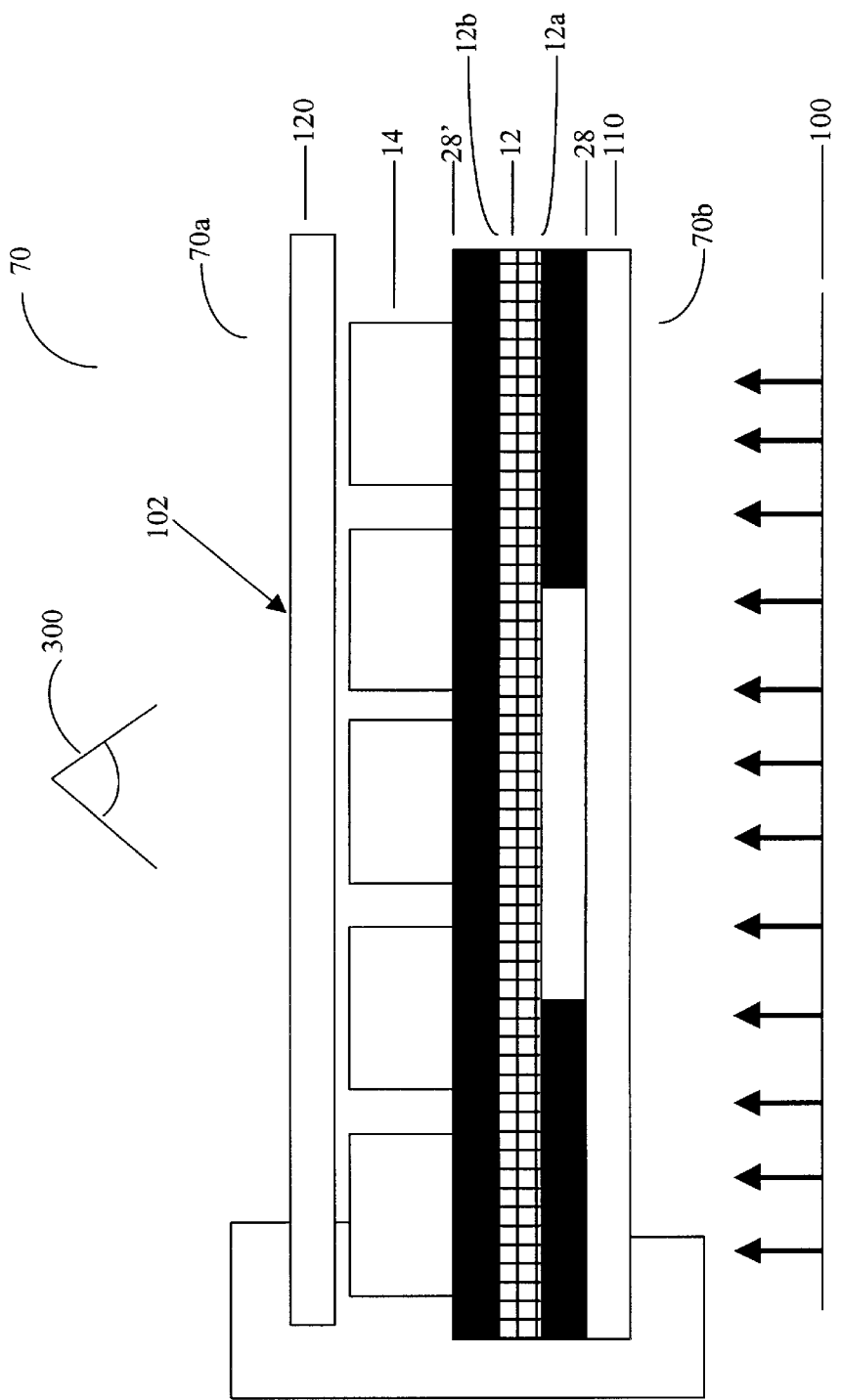
FIG. 4A is a cross-sectional view of an embodiment of a display overlay featuring multiple optical barrier layers.

FIG. 4A depicts an embodiment of a display overlay 70 that includes a photoconductive layer 12, an contrast media layer 14, multiple optical barrier layers 28, 28', a first electrode 110 and a second electrode 120. A first optical barrier layer 28' is disposed between the photoconductive layer second side 12b and an contrast media layer 14. The first optical barrier layer 28' prevents light 102 incident on the front 70a of display overlay 70 from addressing the contrast media layer 14. That is, optical barrier layer 28' prevents "dark currents" from addressing the contrast media layer 14, as described above in connection with FIG. 2. The second optical barrier layer 28 is disposed between the first electrode 110 and the photoconductive layer first side 12a. The second optical barrier layer 28 may be employed to selectively mask the first side 12a, as is described above in connection with FIG. 3, so that the photoconductive layer 12 maintains its impedance at the points where the optical barrier layer 28 is present.

By employing the first optical barrier layer 28, the display overlay 70 may display a desired image that cannot be distorted by light exposure from the front side 70a of the display overlay 70. The desired image may be determined by the selective disposal of the second optical barrier layer 28. In yet another embodiment, the optical barrier layer 28 is disposed over all regions of the photoconductive layer 12 except for the selected regions that remain unmasked. The impedance of the unmasked regions of the first side 12a will lower upon exposure to light 100 from a light source, such as an emissive display.

Figure 4B:
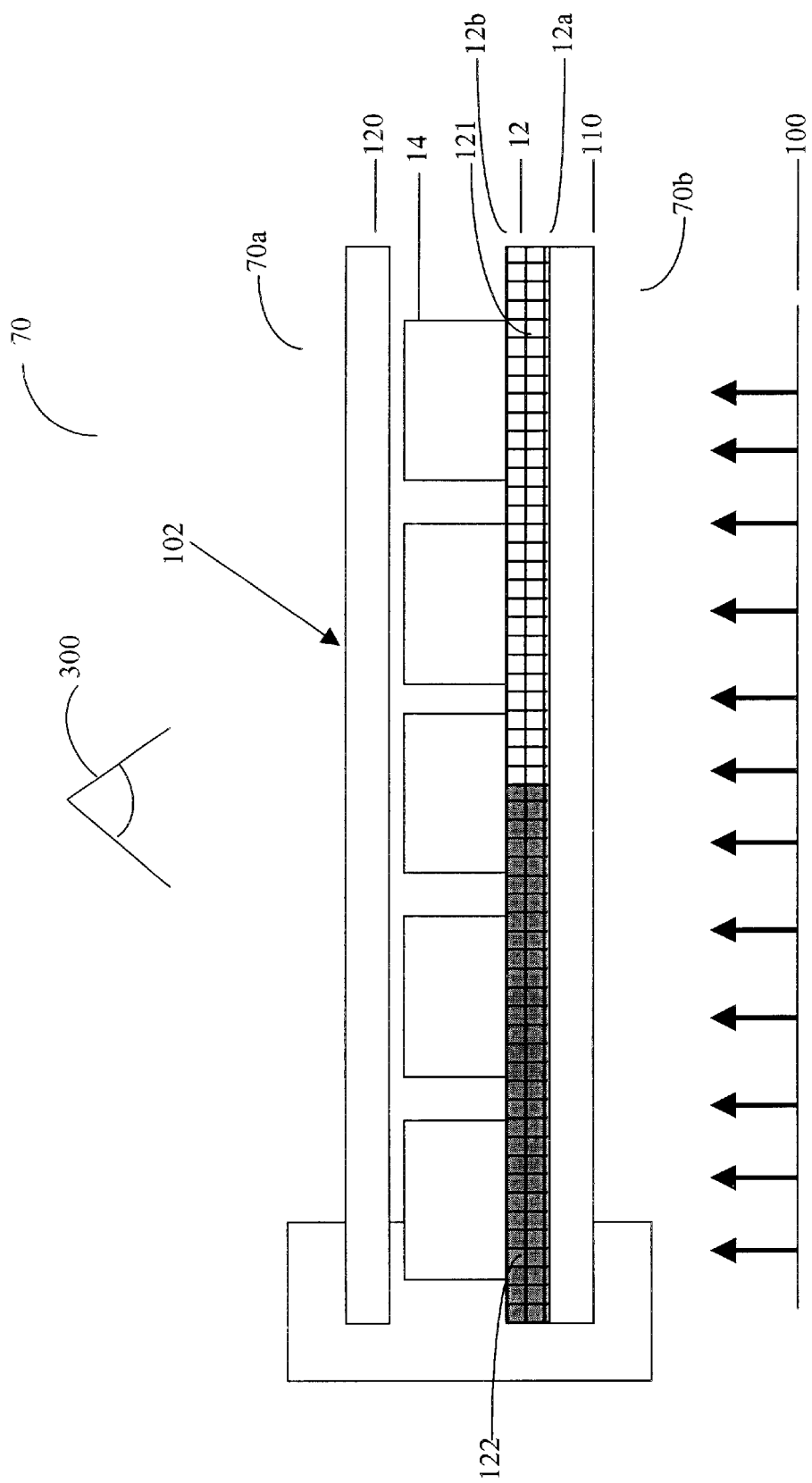
FIG. 4B is a cross-sectional view of an embodiment of a display overlay featuring multiple photoconductive layers.

In other embodiments of the invention, the photoconductive layer may or may not be optically responsive in a uniform manner across the entire display overlay or a pixel of the display overlay. By creating sub-pixel regions in which the photoconductive layer differs, varying optical effects are achieved. One such example is shown in FIG. 4B. FIG. 4B depicts an embodiment of a display overlay 70 that includes a first photoconductive material 121, a second photoconductive material 122, a contrast media layer 14 and electrodes 110 and 120. Each of the first and second photoconductive materials is sensitive to a different variable of incident light, such as the wavelength of the light, the intensity of the light, or the duration of the light. By varying, for example, the wavelength of light from the light source 100, different sub-pixel regions of the contrast media layer 14 may be addressed.

The embodiment as shown in FIG. 4B may have a varying number of sub-pixel regions and different photoconductive materials in order to provide grayscale or color displays. For example, a pixel is split into four sub-pixels with each sub-pixel having a photoconductive material sensitive to, for example, varying levels or durations of light. A single underlying light-emitting layer actuates one, two, three, or four of the sub-pixel regions, and thereby achieves grayscale. The sub-pixels may be of differing areas. In this manner, a grayscale emissive display drives a grayscale electro-optic display. Similarly, in another example, the various sub-pixel regions correspond to varying colors. In this manner, a grayscale emissive display drives a contrast media layer capable of different colors without requiring separate addressing for each of the color sub-pixel regions. The photoconductive layers 12 of the embodiments depicted in FIGS. 1–3, 4A and 4B may be formed having differentially-responsive subregions as just described.

In one embodiment, the display overlay comprises a synchronization module. The synchronization module may receive emissive display output signals and then control the electrodes to apply an electric field in response to the signals. Also, the synchronization module may be adapted to keep an emissive display output signal on for the amount of time necessary to enable the display overlay to be addressed to achieve a desired image. The synchronization module may be integral with the display overlay. In one embodiment, the synchronization module is disposed external to the display overlay.

FIGS. 5–13 are highly diagrammatic views of a display overlay 70 including at least one capsule 214 that may be addressed to provide a display overlay 70 having various colors. In practice, many capsules 214 may be disposed within the contrast media layer 14 of the display overlay 70. In one embodiment, a single pixel of the display overlay has multiple capsules. Different electrodes present in the display overlay 70 may independently address multiple capsules.

Figure 5:
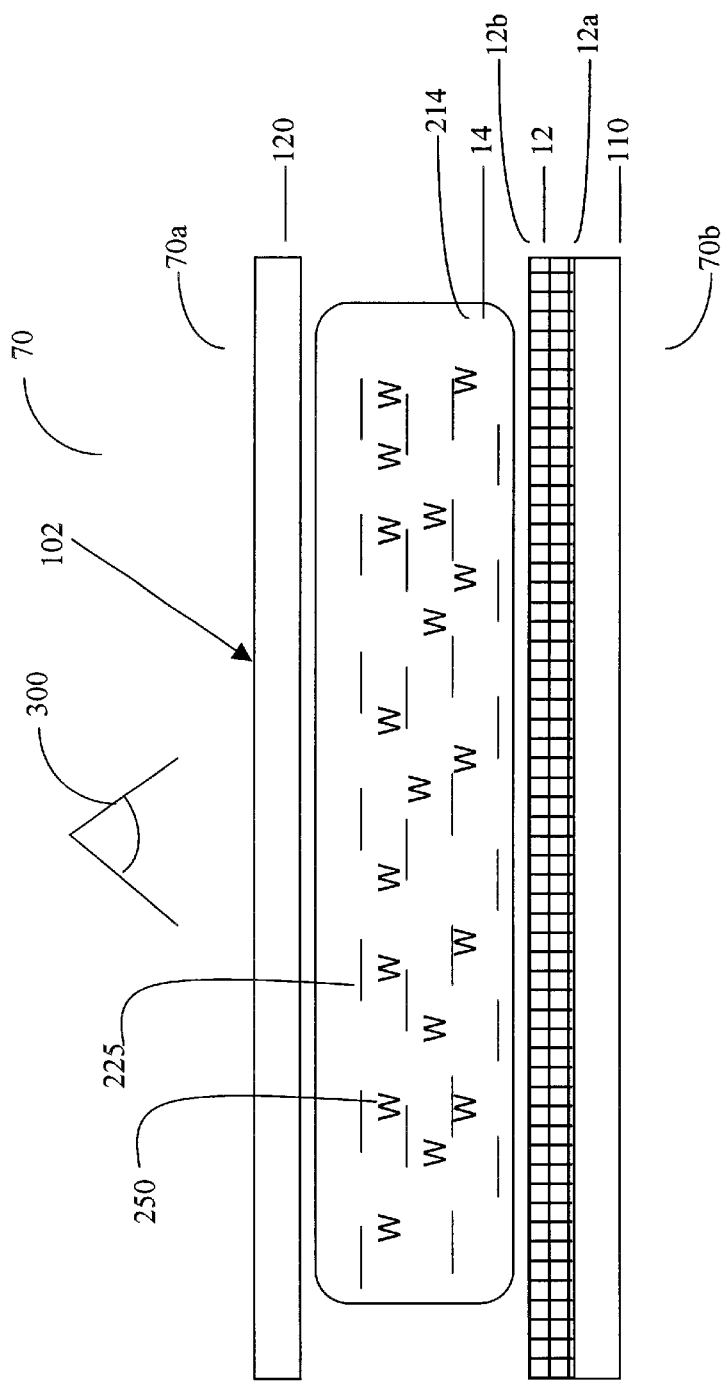
FIG. 5 shows a highly diagrammatic view of one embodiment of a display overview including an encapsulated electro-optic layer.

In one embodiment, depicted in FIG. 5, a black and white display overlay 70 is provided by a number of capsules, such as the capsule 214, which contains negatively charged white particles 250 in a dark, for example a black, dispersing fluid 225. In the embodiment depicted in FIG. 5 the black dispersing fluid 225 is visible and the display overlay 70 is black to a viewer 300. The photoconductive layer 12 is adjacent the capsule 214, which is contained within contrast media layer 14. When an emission of light is exposed to the region of the photoconductive layer 12 adjacent capsule 214 the photoconductive layer 12 impedance is lowered, enabling an electric field to be applied to the capsule 214. Thus, because the contrast media layer 14 is bistable, in order to maintain a black appearance, one may avoid exposing the display overlay 70 to a light emission. Alternatively, where the voltage is turned off the black appearance will remain.

Figure 6:
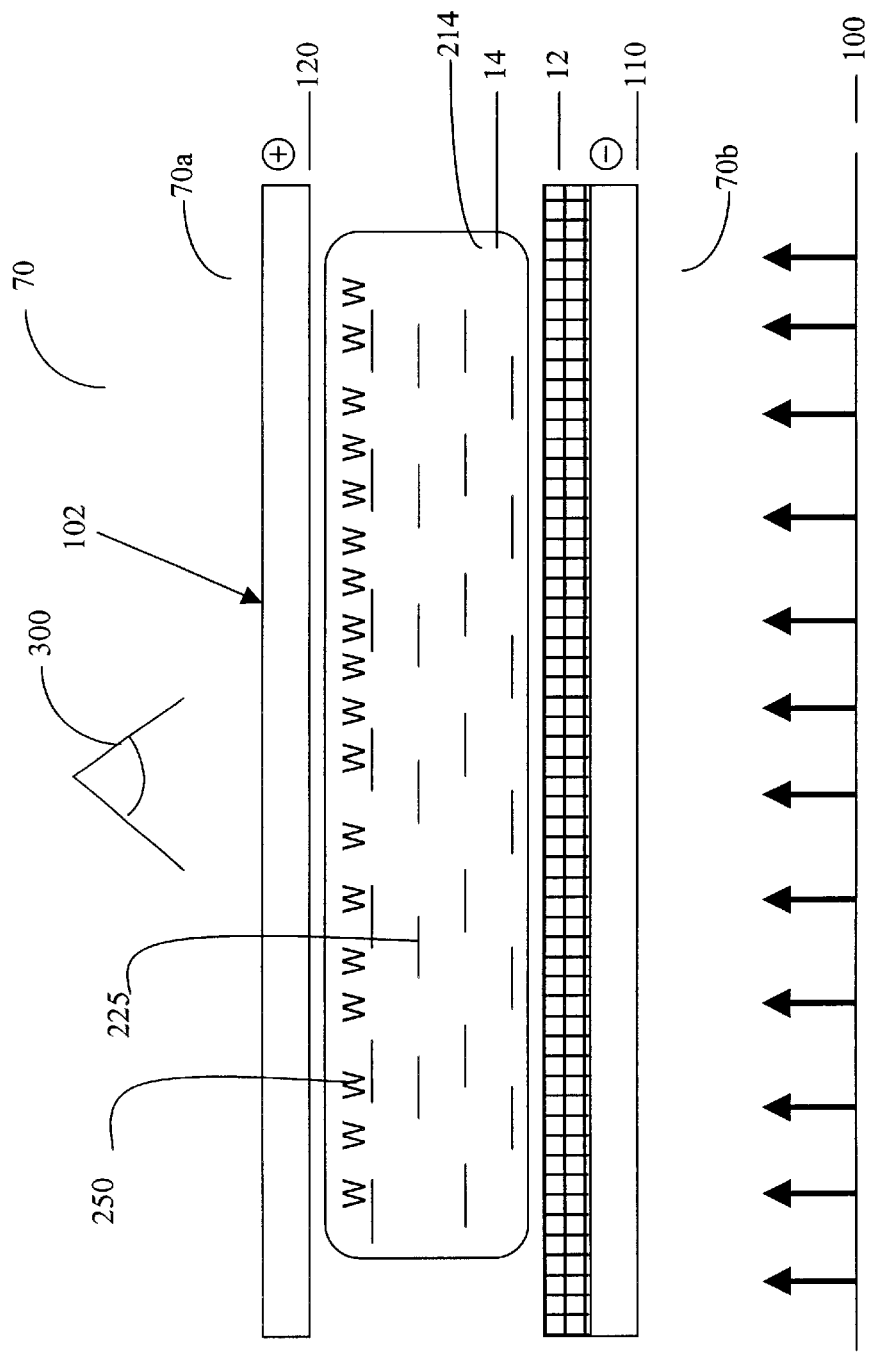
FIG. 6 shows a highly diagrammatic view of another embodiment of a display overview including an encapsulated electro-optic layer.

FIGS. 5–6 depict the steps to be taken to address the display overlay 70 shown in FIG. 5 from a black appearance to a white appearance at viewpoint 300. A light emission 100 is exposed to the region of the photoconductive layer 12 adjacent capsule 214. The light 100 lowers the impedance and enables an electric field to be applied to the capsule 214. A positive electric field is applied to electrode 120 and the negatively charged white particles 250 are attracted to the side of the capsule 214 closest to viewpoint 300.

Figure 7:
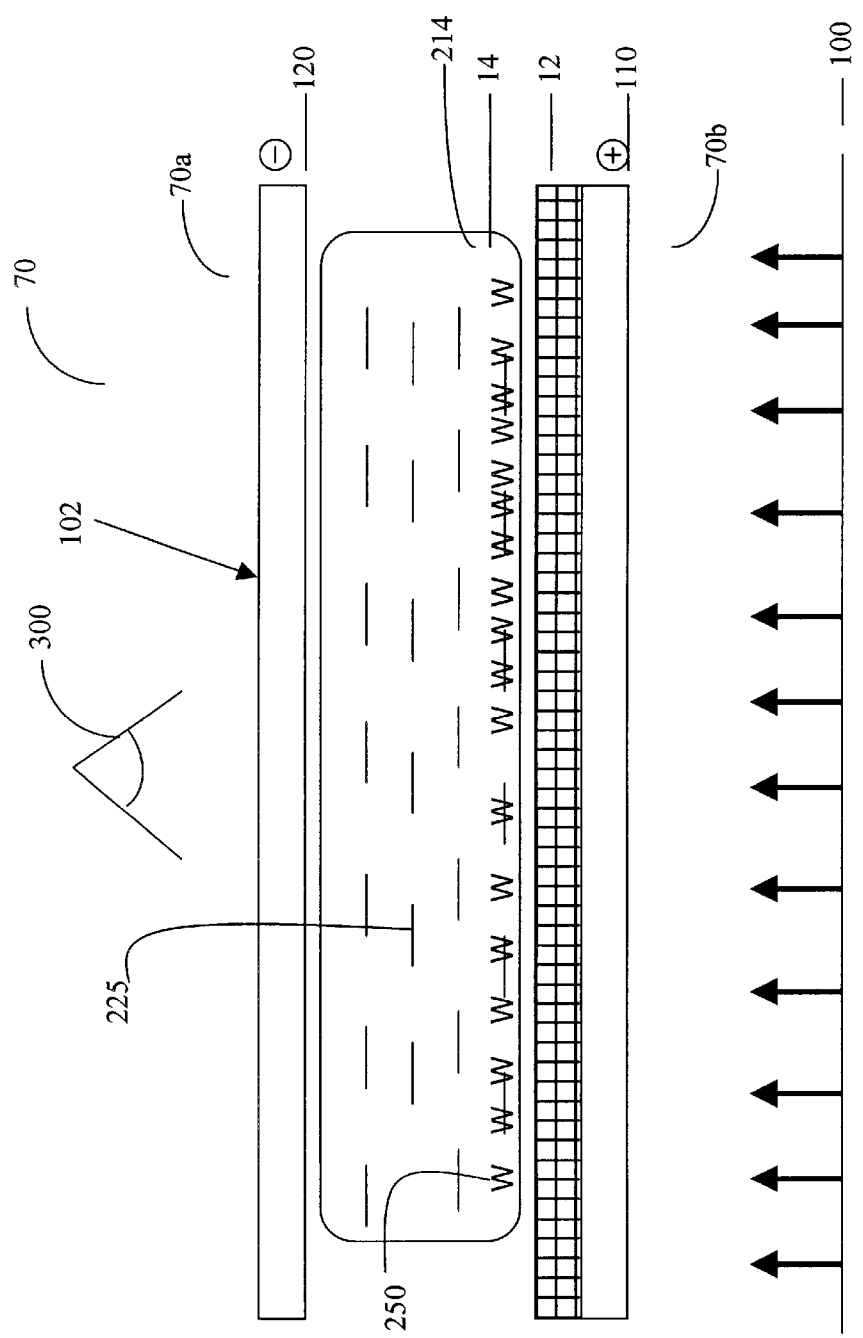
FIG. 7 shows a highly diagrammatic view of another embodiment of a display overview including an encapsulated electro-optic layer.

FIGS. 6–7 depict the steps to be taken to address the display overlay 70 to transition from a white appearance to a black appearance at viewpoint 300. Light 100 is exposed to the region of the photoconductive layer 12 adjacent capsule 214, lowering the impedance and enabling an electric field to be applied to the capsule 214. A positive electric field is applied to electrode 110 and the negatively charged white particles 250 are attracted to the opposite side of the capsule 214 toward the side of the light 100 and the black dispersing fluid is visible from the viewpoint 300.

The contrast media layer 14 can be used to fabricate a color display overlay 70 by providing red, green and blue capsules 214 disposed in lateral arrangement to one another. Each colored capsule 214 forms a sub-pixel of a single RGB pixel. Photoconductive layer 12 may be fabricated from different materials, each of which is responsive to a different one of red light, green light or blue light. Alignment of the photoconductive layer 12 with the respective sub-pixels allows red, green, or blue light 100 to lower the impedance of the photoconductive layer 12. Electrodes 110, 120 then address respective sub-pixel capsules 214. Changing the state of a red, green, or blue pixel to black (or vice-versa) is accomplished using the same techniques as described in connection with FIGS. 5–7.

Figure 8:
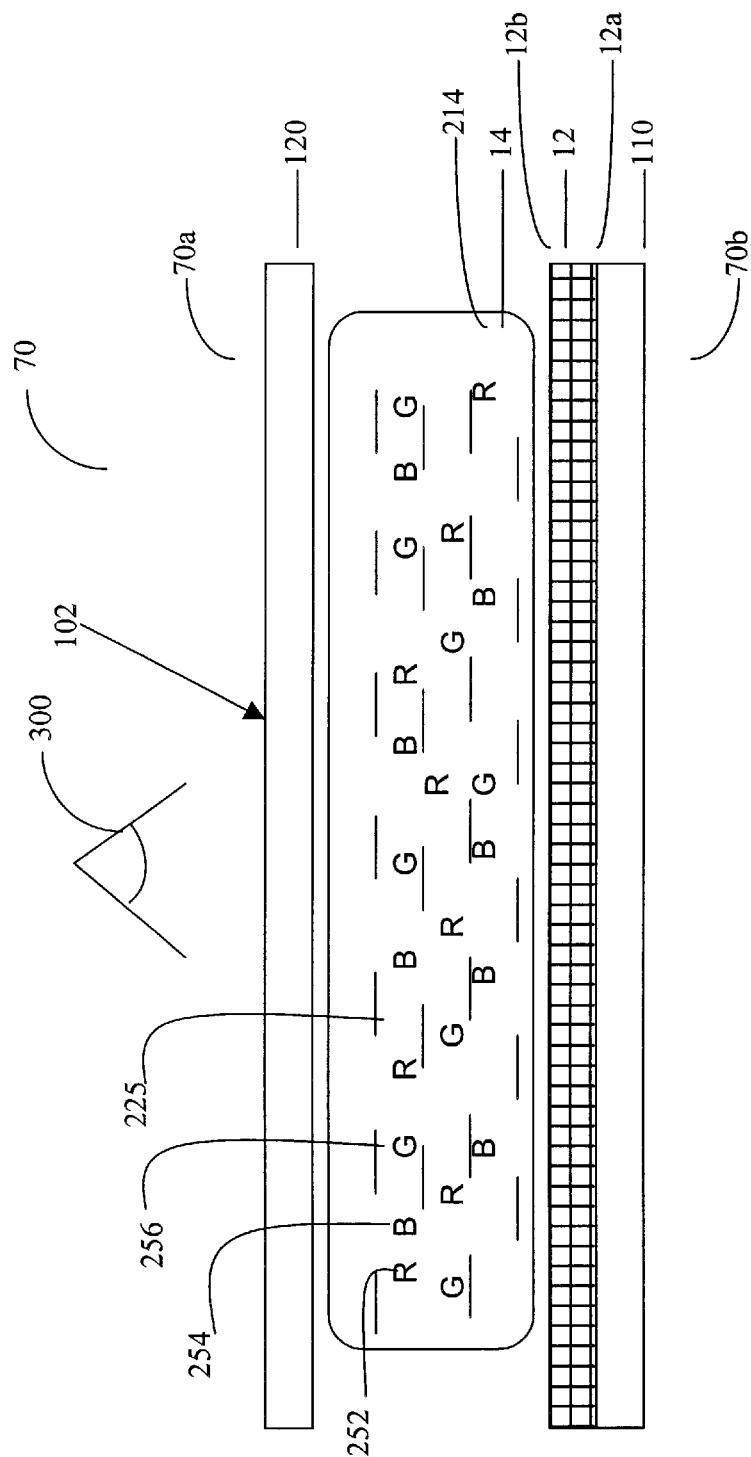
FIG. 8 shows a highly diagrammatic view of another embodiment of a display overview including an encapsulated electro-optic layer.

In another embodiment, depicted in FIG. 8, a color display overlay 70 is provided by a capsule 214 containing multiple species of particles in a clear, dispersing fluid 225. Each species of particles has different optical properties and possess different electrophoretic mobilities ($\mu$) from the other species. In the embodiment depicted in FIG. 8, the capsule 214 contains red particles 252, blue particles 254, and green particles 256. The magnitude of the electrophoretic mobility of the red particles 252, on average, exceeds the electrophoretic mobility of the blue particles 254, on average, and the electrophoretic mobility of the blue particles 254, on average, exceeds the average electrophoretic mobility of the green particles 256. As an example, there may be a species of red particle with a zeta potential of 100 millivolts (mV), a blue particle with a zeta potential of 60 mV, and a green particle with a zeta potential of 20 mV. Generally, the red particle 252 will move most rapidly and require a relatively fast pulse to move from one electrode to the other, the blue particle 254 will move next most rapidly and require a medium pulse to move from one electrode to the other, and the green particle 256 will move least rapidly and will require a long pulse to move from one electrode to the other.

Figure 9:
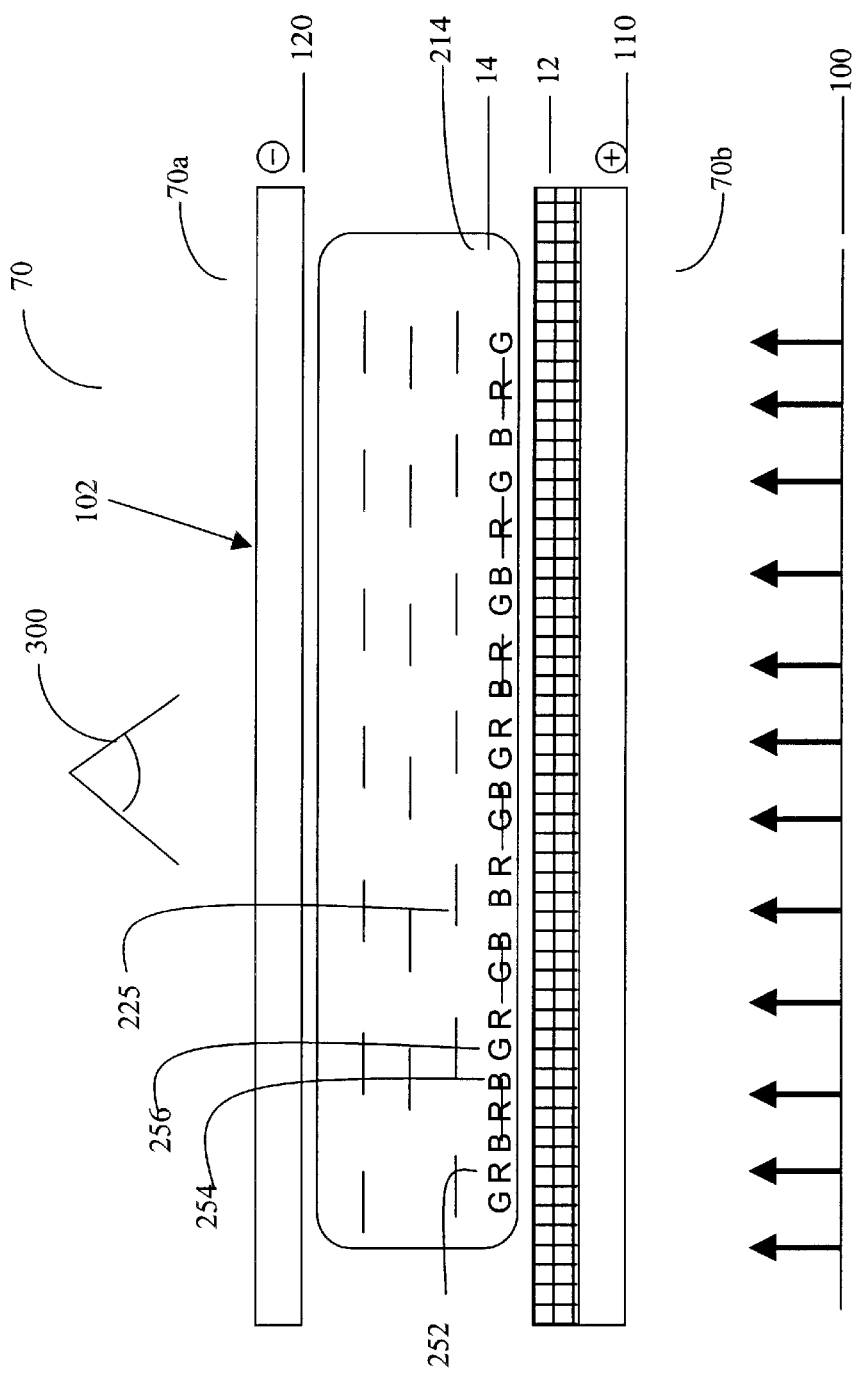
FIG. 9 shows a highly diagrammatic view of another embodiment of a display overview including an encapsulated electro-optic layer.
Figure 10:
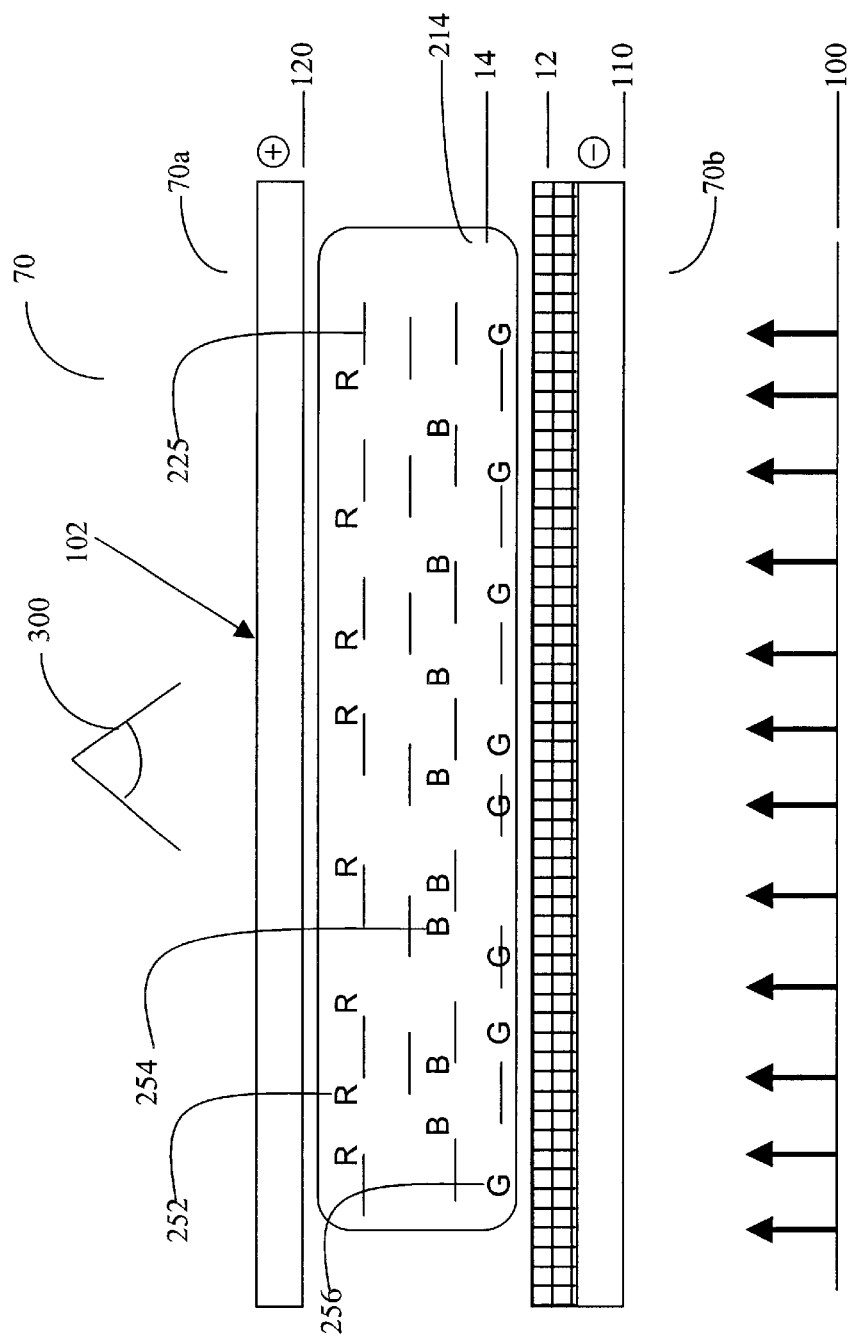
FIG. 10 shows a highly diagrammatic view of another embodiment of a display overview including an encapsulated electro-optic layer.

FIGS. 9–10 depict the steps to be taken to address the display shown in FIG. 8 to display a red color to a viewpoint 300. Referring to FIG. 8, all the particles 252, 254, 256 are attracted to one side of the capsule 214 by applying an electric field in one direction. Referring to FIG. 9, the photoconductive layer 12 is adjacent the capsule 214 which is contained within electro-optic layer 14. Light 100 is exposed to the region of the photoconductive layer 12 adjacent capsule 214. The light 100 lowers the impedance and enables a long electric field pulse to be applied to the capsule 214 long enough to attract even the more slowly moving green particles 256 to the electrode 110. When all of the particles have moved to electrode 110, the viewpoint 300 sees the color of the dispersing fluid 225, for example black. Referring to FIG. 10, the light 100 stays on and the electric field is reversed just long enough (e.g., a fast pulse) to allow the red particles 252 to migrate towards the electrode 120. The blue particles 254 and green particles 256 will also move in the reversed electric field, but they will not move as fast as the red particles 252 and thus will be obscured by the red particles 252. The amount of time for which the applied electric field must be reversed can be determined from the relative electrophoretic mobilities of the particles, the strength of the applied electric field, and the size of the capsule. In order to maintain a red color, the light 100 may be turned off, preventing the particles contained within capsule 214 from being addressed.

Figure 11:
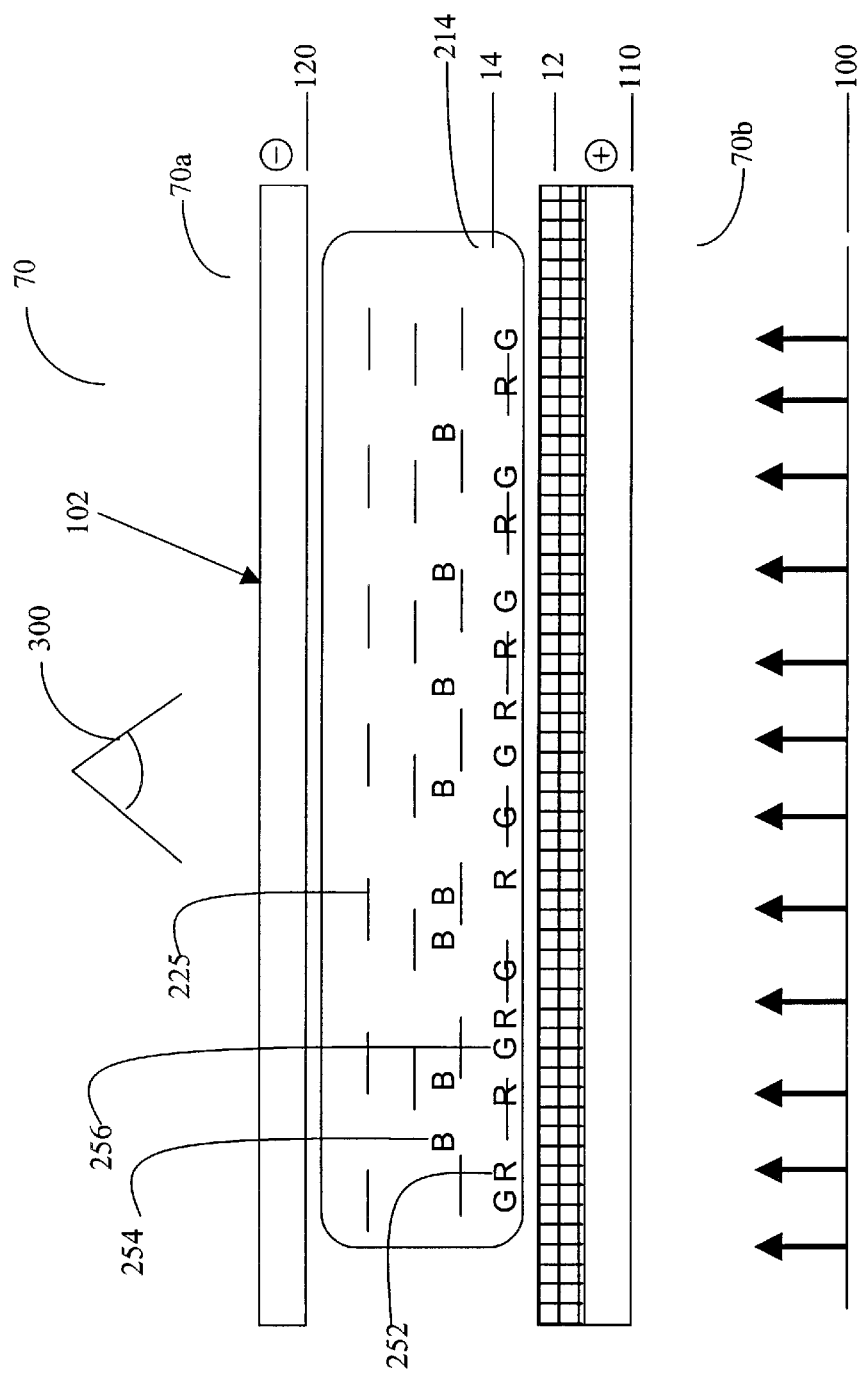
FIG. 11 shows a highly diagrammatic view of another embodiment of a display overview including an encapsulated electro-optic layer.

FIGS. 10–11 depict the steps to be taken to address the display shown in FIG. 10 to display a black color to a viewpoint 300. Referring to FIG. 11, the light 100 stays on and the electric field is reversed just long enough (e.g., a short pulse) to allow the red particles 252 to migrate towards the electrode 110. The blue particles 254 will also move in the reversed electric field, away from viewpoint 300 but they will not move as fast as the red particles 252. The green particles 256 will substantially retain their position. The viewpoint 300 sees the color of the black dispersing fluid 225.

Figure 12:
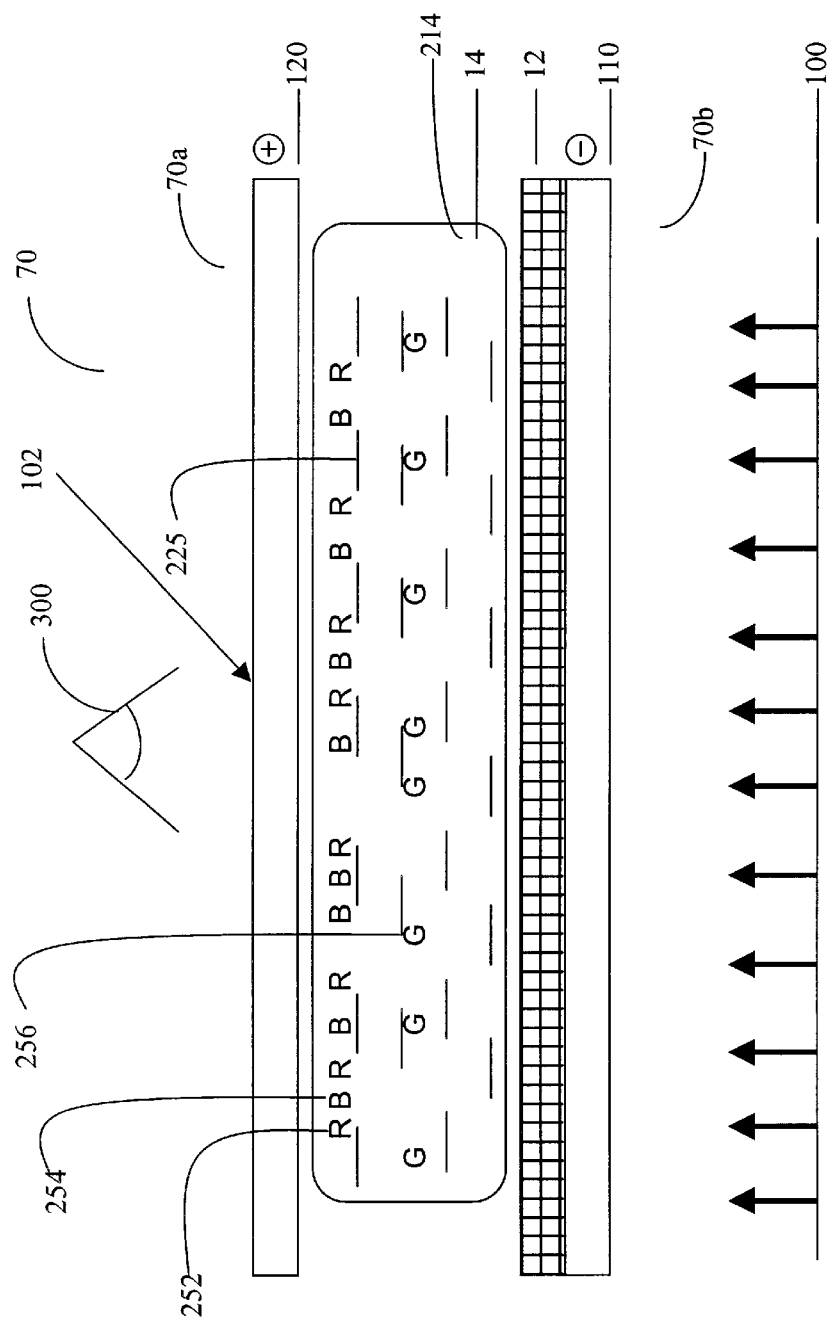
FIG. 12 shows a highly diagrammatic view of another embodiment of a display overview including an encapsulated electro-optic layer.
Figure 13:
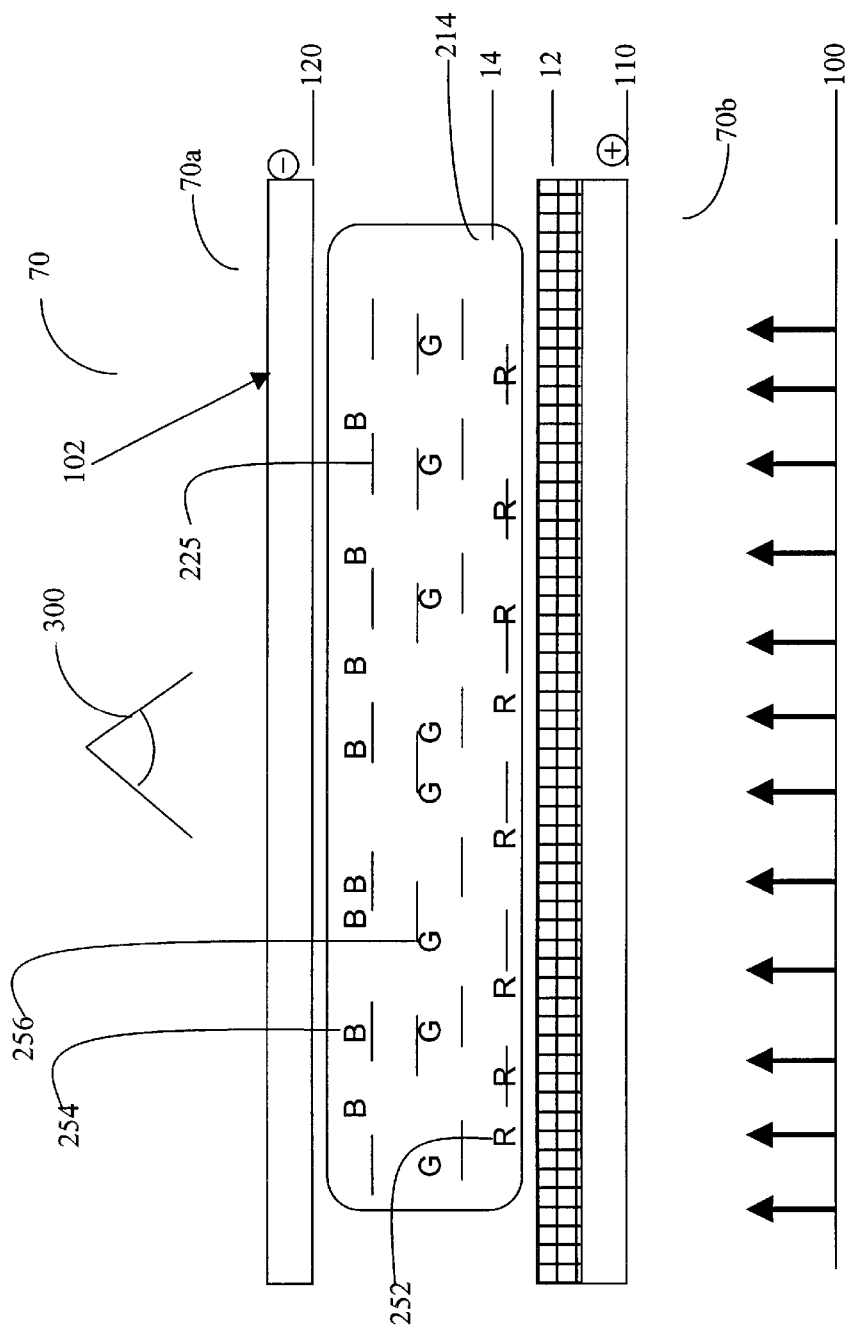
FIG. 13 shows a highly diagrammatic view of another embodiment of a display overview including an encapsulated electro-optic layer.

FIGS. 11–13 depict the steps to be taken to address the display shown in FIG. 11 to display a blue color to a viewpoint 300. Referring to FIG. 12, the light 100 stays on and the electric field is reversed just long enough to allow the red particles 252 and the blue particles 254 to migrate from the electrode 110 towards the electrode 120 (e.g., a medium pulse). The green particles 256 will also move in the reversed electric field, away from the electrode 110, but they will not move as fast as the red particles 252 and the green particles 256. Referring now to FIG. 13, the light 100 stays on enabling electro-optic layer 14 containing capsule 214 to be addressed then the electric field is reversed again, just long enough to allow the red particles 252 to migrate from electrode 120 to electrode 110 (e.g., a short pulse). The amount of time for which the applied electric field must be reversed can be determined from the relative electrophoreticmobilities of the particles, the strength of the applied electric field, and the size of the capsule.

Table 1 illustrates the steps required to achieve the desired color, referring generally to FIG. 8, from the viewpoint 300 in a capsule 214 of a display overlay 70 containing red, blue, and green particles.

TABLE 1

| Starting Color | Desired Color | Steps: |
|---|---|---|
| Black | Black | Provide no light or apply no voltage |
| Black | Red | 1 fast pulse at electrode 120 |
| Black | Blue | 1 medium pulse at electrode 120, then one fast pulse at electrode 110 |
| Black | Green | 1 long pulse at electrode 120, then one medium pulse at electrode 110 |
| Red | Black | 1 fast pulse at electrode 110 |
| Red | Blue | 1 medium pulse at electrode 120, then one fast pulse at electrode 110 |
| Red | Green | 1 long pulse at electrode 120, then one medium pulse at electrode 110 |
| Red | Red | Provide no light or apply no voltage |
| Blue | Black | 1 medium pulse at electrode 110 |
| Blue | Red | 1 medium pulse at electrode 110, then one fast pulse at electrode 120 |
| Blue | Green | 1 long pulse at electrode 120, then one medium pulse at electrode 120 |
| Blue | Blue | Provide no light or apply no voltage |
| Green | Black | 1 long pulse at electrode 110 |
| Green | Red | 1 long pulse at electrode 110, then 1 fast pulse at electrode 120 |
| Green | Blue | 1 long pulse at electrode 110, then 1 medium pulse at electrode 120, then 1 fast pulse at electrode 110 |
| Green | Green | Provide no light or apply no voltage |

The display overly 70 described in FIGS. 5–13 are in communication with a synchronization module that controls the first electrode and the second electrode. For embodiments in which the display overlay 70 is used in conjunction with a computer display, the synchronization module may be provided as software. For example, the synchronization module may be provided as a device driver that replaces a standard device driver for the computer display. Alternatively, the synchronization module may be provided as a software process or subsystem that intercepts graphics API calls made by application programs executing on the computer and translating those API calls into commands that are sent to the display overlay 70 or to both the display overlay 70 and the emissive display. In these embodiments, the synchronization module may send commands to the display overlay over a wireless connection, such as Bluetooth or the wireless protocol specified by IEEE 802.11, or over a bus connection such as RS-232, SCSI, USB, ADB, Fibre Channel, or Fire Wire. Almost any form of connection may be used, since as described in more detail below, in preferred embodiments of the invention such as those shown in FIG. 2, the overlay 70 may only need to receive "timing" signals from the emissive display 100 to indicate when the image on the overlay 70 needs to be updated, and the data rate of such timing signal is so low that any form of connection may be used. As discussed below, in such preferred embodiments, the transfer of the much greater amounts of data needed to define the image to be placed upon the overlay 70 is effected optically by the action of the light from the emissive display 100 on the photoconductor layer 12.

When the display overlay 70 receives signals over a bus such as an RS-232 or USB which contains voltage supply lines, the overlay may derive power for applying a voltage to the electrodes 110, 120 from the bus connection. If, as is likely, the electrodes of the overlay 70 require voltages higher than those supplied by bus used, any conventional voltage boosting circuit (for example, a combination of an EL inverter and a single H Bridge switching stage), may be used to provide the voltages needed by the electrodes. Alternatively, the display overlay 70 may provide its own power source such as a battery or means for connecting to an electrical outlet.

However, the overlay 70 may also receive all signals from the emissive device via an optical rather than an electrical interface; this may be especially convenient where the overlay is intended to be used with various models of computer, since it may be easier to provide software for numerous models of computer than to rely upon all such computers having a particular physical interface required for connection to the overlay. Essentially, such optical transfer of signals is effected by using portions of the emissive display to display signaling values, and having a photosensor in the overlay read the signaling values thus displayed. Certain portions of the emissive display could be reserved solely for signaling; for example, using a narrow strip (perhaps only one or two pixels wide) along one edge of the display for signaling would typically be unnoticeable by a user. Alternatively, the areas used for signaling could also be used for image display, but the emissive display could be controlled so as to produce a special signals (for example, a series of black and white flashes of specified lengths, which a microcontroller or other logic device in the overlay would recognize as a signal rather than part of an image to be displayed.

Instead of providing conventional photosensors for such optical communication, portions of the photoconductor layer 12 may be adapted for this purpose. If the contrast media layer 14 is omitted from a "signal" portion of the overlay 70 shown in FIG. 2, and the electrodes 110 and 120 are patterned so that the discrete electrodes are provided for this signal portion, the signal portion will function as an optically activated electrical switch. Only two such switches are needed for optical control of the overlay, one switch serving to activate the voltage supply circuitry needed to generate the voltage required, and the other to specify the polarity with which the voltage should be applied to the electrodes. If five such switches were provided, no logic circuitry would be required in the overlay, since one switch could serve to activate the voltage supply circuitry and the other four could be connected in an H Bridge to switch the output from the voltage supply circuitry to the two electrodes with either polarity. Indeed, by providing a sixth such switch, and choosing a photoconductor layer and emissive display with appropriate characteristics, the sixth switch could form a major portion of the voltage supply circuitry. In this embodiment, the emissive display triggers the sixth switch using a high frequency light signal. The resultant rapid switching of the sixth switch, which is connected to a single diode and to a capacitor in a known manner to form a boost regulator, generates the necessary voltage. This embodiment provides a simple, inexpensive and robust overlay.

For embodiments in which the display overlay 70 is used in conjunction with an emissive display that is not associated with a computer, the synchronization module may be provided as automata embodied in special purpose hardware such as programmable microcontrollers, application-specific integrated circuits, programmable logic devices, programmable array logics, or field-programmable gate arrays.

The preferred method of operating an electro-optic overlay of the type shown in FIG. 2 is as follows. Suppose that the electrophoretic particles are initially distributed throughout the electro-optic layer in a condition similar to that shown in FIG. 5. The light 100 from an emissive display is first set to show all white (thus rendering the whole of the photoconductor layer 12 conductive), while the electrode 110 is made positive relative to the electrode 120. The electrophoreticparticles thus move towards the electrode 110, producing a condition similar to that shown in FIG. 6, in which the black dispersing fluid 225 is visible to the observer, so that at viewpoint 300 the overlay shows solid black.

Referring to FIG. 6, next, to write an image on the overlay, the desired image is produced on the emissive display, and the electrode 120 is made positive relative to the electrode 110. In areas where the emissive display is white light 100 strikes the photoconductive layer 12 is thus rendered conductive, the electrophoretic white particles 250 move adjacent the electrode 120, so these areas of the overlay appear white (not shown), while in the areas where the emissive display is black, the photoconductor layer 12 remains non-conductive, the electrophoretic white particles 250 do not move, and these areas of the overlay remain black. Thus, the overlay displays an image at viewpoint 300 corresponding to that the image on the emissive display.

After a time t sufficient for the particles in the "white" areas to travel adjacent the front electrode 120, the voltage between the electrodes 110 and 120 can be reduced to zero in order to keep the energy consumption of the overlay to a minimum; in the bistable electro-optic medium, the particles remain stationary and the image persists. At this time, the emissive display may also be turned off, thus reducing its energy consumption, When it is desired to display a new image on the overlay, the "old" image is again displayed on the emissive display, and the electrode 110 is made positive relative to the electrode 120 for a time t. This causes the same areas of the photoconductor as during the writing of the image to be conductive, and the particles adjacent the electrode 120 to move adjacent the electrode 110, thus restoring the overlay to again display solid black. The overlay is now ready for writing of a new image in the manner already described.

A new image could of course be written to the display by first re-initializing the display in the manner already described, with light 100 from the the emissive display showing all white. However, certain type of electro-optic media show a "memory" effect in which the dark state of the display following application of a drive pulse of limited varies slightly depending upon whether the relevant pixel was previously black or white. Thus, the dark state of the display following re-initialization might not be completely homogeneous. Accordingly, the previously described technique, whereby the original image is maintained on the emissive display while the polarity of the field between the electrodes is reversed for the same period as used to write the original image, may be preferred.

Figure 14:
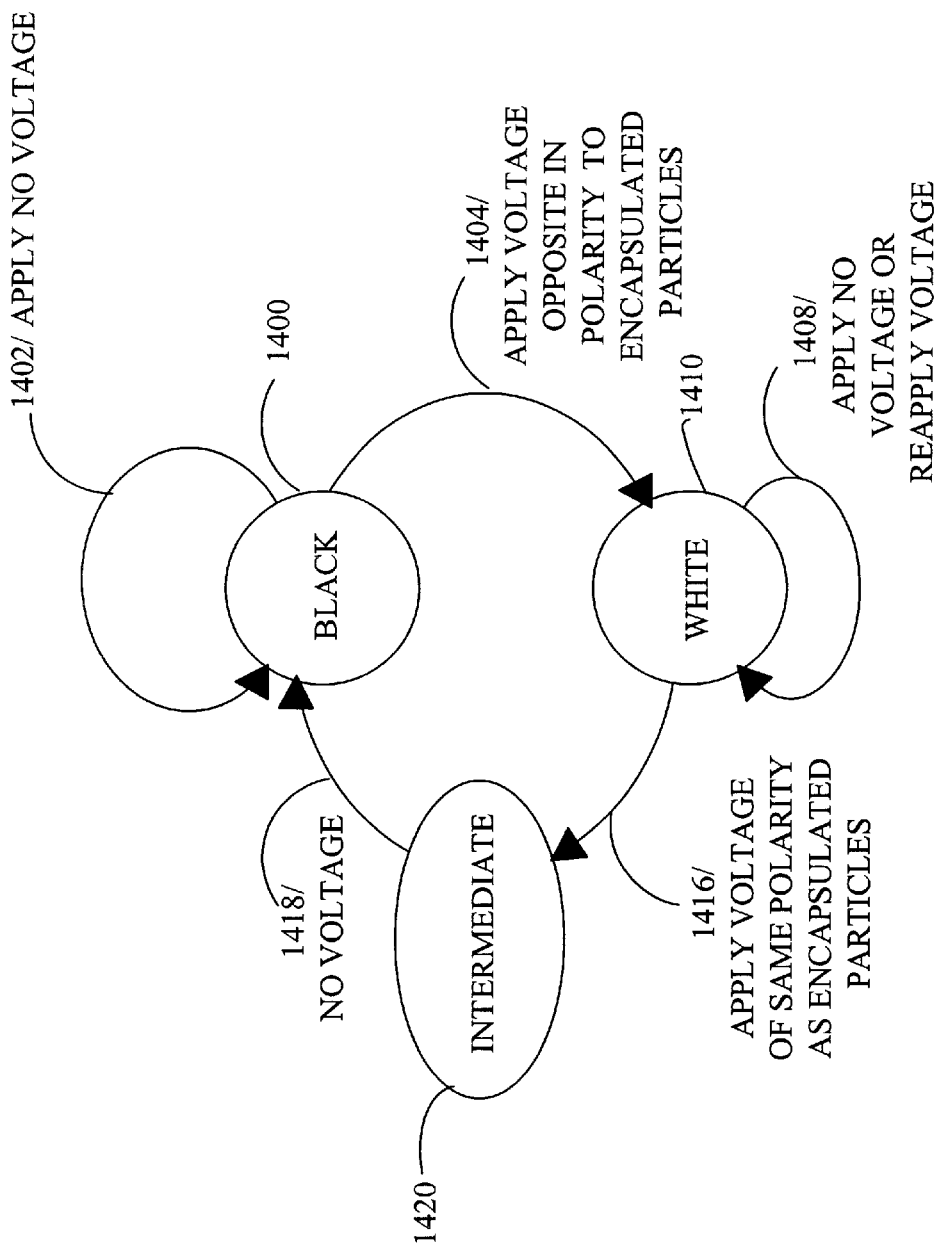
FIG. 14 shows one embodiment of a state machine for controlling a black/white display overlay.

FIG. 14 depicts the state diagram for one embodiment of a state machine to control a black/white display overlay 70 of the present invention on a pixel by pixel basis. State 1400 represents the state in which the display overlay 70 shows black to the viewer 300. In order to remain in state 1400, the state machine does not need to take any action (1402), that is, it will not apply a voltage to electrodes 110, 120. Without an electric field between the electrodes 110, 120, the display media will not change state, because it is bistable.

To transition from the black state 1400 to a white state 1410, the state machine applies a voltage (1404) to the electrodes in order to create an electric field between the electrodes that is opposite in polarity to the charged, white particles. Because the emissive display is emitting light, the impedance of the photoconductive layer 12 is reduced and the applied voltage addresses the display media 14.

Once in the white state 1410, the state machine does not need to re-address the display media 14 in order to maintain the white state because the display media 14 is bistable. In some embodiments, the state machine may re-address the display media every n cycles, since the state of the display media may slowly decay over time.

To transition from the white state 1410 to the black state 1400, the state machine implements an intermediate state 1420. The intermediate state 1420 is necessary because, for this transition the emissive display is dark, i.e., no light is incident on the photo conductive layer 12 and, therefore, the electrodes 110, 120 are unable to address the display media 14. The intermediate state 1420 extends the white state of the emissive display long enough for the electrodes to address the display media 14. In some embodiments this is accomplished by controlling the contents of video RAM. In other embodiments, the synchronization module is provided with the next visual state of the emissive display before the emissive display receives it. The length of the intermediate state can be as long as 1 second, more preferably 500 milliseconds, even more preferably 400 milliseconds, still more preferably 300 milliseconds, even more preferably 100 milliseconds and most preferable 30 milliseconds.

From this general discussion it is well within the capabilities of one of ordinary skill in the art to formulate a state machine for the three-color system described in connection with FIGS. 8–13.

The displays and overlays of the present invention can display gray scale. Although many commercial photoconductors have very sharp thresholds (i.e., the resistance of the photoconductor changes dramatically over a relatively small range of light intensity), photoconductors are known with much wider thresholds, so that the resistance of the photoconductor varies smoothly with light intensity over a considerable range of light intensities. One may use such "wide threshold" photoconductors in a display or overlay of the present invention, and carefully controlling the duration t of the period for which the one electrode 110 is made positive relative to the other electrode 120 to transfer an image from the emissive display to the overlay. One can achieve a situation in which, in the areas of the photoconductor exposed to the whitest areas of the emissive display, the electrophoretic particles experience sufficient field to enable them to travel the maximum distance towards the viewing surface of the overlay. While in the areas of the photoconductor exposed to less bright gray areas of the emissive display, the electrophoreticparticles experience a lesser field, and travel less than the full distance towards the viewing surface of the overlay, thereby producing a gray area on the overlay. Hence, the overlay displays a gray scale image.

Obviously, in such a gray scale display, the response of the photoconductor may not match that of the human eye, to which the image on the emissive display will normally be adjusted, and hence the gray scale values on the overlay may not match those on the emissive display. However, the image on the emissive display can readily be adjusted by conventional image processing techniques to provide correct gray scale values on the overlay.

It will readily be apparent to those skilled in display technology from the foregoing discussion that the present invention can be used intensity and/or wavelength shift images to assist viewing of these images by the human eye. For example, some organic light emitting diode (OLED) displays are so dim that they are difficult to see except in darkened rooms, and an overlay of the present invention could be used to enable such displays to be under brighter lighting. Also, the use of the present invention to enable back-lit LCD's to be viewed in bright sunlight has already been discussed above. Similarly, by using a photoconductor sensitive to non-visible wavelengths, the displays of the present invention can be used to convert a non-visible image to a visible one; thus, for example a display of the invention using a photoconductor sensitive to infra-red radiation could be used as the output device to an infra-red imaging system. The present invention may also be useful in extending the life of some emssive displays. For example, the lifetime of many electroluminescent displays is adversely affected when the display is driven at high brightness. Using such an electroluminescent display in conjunction with an overlay of the present invention enables the electroluminescent display to be driven at lower brightness, thus increasing its working life.

When the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A reflective electro-optic display in optical communication with an emissive display, comprising:
    (a) an electro-optic layer;
    (b) a photoconductive layer adjacent the electro-optic layer;
    (c) a first electrode, adjacent a first side of the photoconductive layer;
    (d) a second electrode, adjacent the electro-optic layer; and
    (e) a synchronization module receiving signals indicative of emissive display output and controlling the first and second electrodes to apply an electric field to the electro-optic layer responsive to the received signals.

2. The display of claim 1 wherein the electro-optic layer comprises at least one capsule containing a suspending fluid having a first optical property and a particle having a second optical property, wherein application of said electric field causes said capsule to change visual state responsive to said optical properties of said suspending fluid and said particle.

3. The display of claim 2 wherein said particle is substantially white.

4. The display of claim 2 wherein said particle is black.

5. The display of claim 2 wherein said particle is red.

6. The display of claim 2 wherein said suspending fluid is substantially transparent.

7. The display of claim 2 wherein said suspending fluid is substantially black.

8. The display of claim 2 wherein the electro-optic layer comprises at least one capsule containing at least a first particle and a second particle, said first particle having a first optical property and a said second particle having a second optical property, wherein application of said electric field causes said capsule to change visual state responsive to said optical properties of said particles.

9. The display of claim 8 wherein said at least one particle is substantially white.

10. The display of claim 8 wherein said at least one particle is black.

11. The display of claim 8 wherein said capsule contains at least one red particle, at least one blue particle, and at least one green particle.

12. The display of claim 1 wherein the electro-optic display visual appearance is substantially similar to the visual appearance of an emissive display.

13. The display of claim 1 further comprising an emissive display.

14. The display of claim 13 wherein the emissive display comprises a cathode ray tube.

15. The display of claim 13 wherein the emissive display comprises an LCD.

16. The display of claim 1 wherein the first electrode is selected from the group of translucent, transparent, and light-transmissive.

17. The display of claim 16 wherein the first electrode comprises indium tin oxide.

18. The display of claim 1 wherein the display further comprises an optical barrier layer between a second side of the photoconductive layer and the electro-optic layer.

19. The display of claim 18 wherein the optical barrier layer comprises a conductive material.

20. The display of claim 18 wherein the optical barrier layer has anisotropic electrical conductivity, having a greater conductivity through its thickness than in its plane.

21. The display of claim 1 wherein the second electrode is selected from the group of translucent, transparent, and light-transmissive.

22. The display of claim 21 wherein the second electrode comprises indium tin oxide.

23. The display of claim 1 further comprising a protective layer adjacent the first electrode.

24. The display of claim 1 further comprising a protective layer adjacent the second electrode.

25. The display of claim 1 wherein the synchronization module controls the first and second electrodes via a USB.

26. The display of claim 1 wherein the display comprises a power source.

27. The display of claim 26 wherein the power source comprises a battery.

28. The display of claim 1 wherein the synchronization module controls the first and second electrodes via a serial cable.

29. The display of claim 1 wherein the display is integral with the emissive display.

30. The display of claim 1 wherein the photoconductive layer comprises material selected from the group consisting of organic photoconductive polymers, dye-aggregate photoreceptors, and pigment-based photoconductors.

31. The system of claim 1 wherein the photoconductive layer comprises 2,4,7-trinitro-9-fluorine complexed with poly(N-vinylcarbazole).

32. The display of claim 1 wherein the synchronizing module controls the first and second electrodes via an optical interface.

33. The display of claim 1 wherein the synchronization module comprises a device driver.

34. The display of claim 1 wherein the synchronization module comprises a thread.

35. The display of claim 1 wherein the synchronization module comprises a sub-system.

36. A method of controlling a reflective display to have a visual appearance substantially similar to an emissive display, the reflective display including an electro-optic layer adjacent a photoconductive layer, a first electrode adjacent a first side of the photoconductive layer, and a second electrode adjacent the electro-optic layer, the method comprising the steps of:
    (a) receiving signals indicative of output from the emissive display; and
    (b) controlling the first and second electrodes to apply an electric field to the electro-optic layer responsive to the received signals.

37. The method of claim 36 wherein step (b) comprises:
    (b) transmitting a control signal to the first and second electrodes via a USB.

38. An article of manufacture for controlling a reflective display to have a visual appearance substantially similar to an emissive display, the reflective display including an electro-optic layer adjacent a photoconductive layer, a first electrode adjacent a first side of the photoconductive layer, and a second electrode adjacent the electro-optic layer, the article comprising:

(a) computer-readable program means for receiving signals indicative of output from the emissive display; and (b) computer-readable program means for controlling the first and second electrodes to apply an electric field to the electro-optic layer responsive to the received signals.

39. The article of manufacture from claim 38 wherein the computer-readable program means comprises:

computer-readable program means for transmitting a control signal to the first and second electrodes via a USB.

40. A reflective electro-optic display in optical communication with an emissive display, comprising:

(a) an electro-optic layer;

(b) a photoconductive layer adjacent the electro-optic layer;

(c) a means for applying an electric field across the electro-optic layer; and (d) a synchronization module receiving signals indicative of emissive display output and controlling the means for applying an electric field to the electro-optic layer responsive to the received signals.

41. The display of claim 40 wherein the means for applying an electric field comprises electrostatic charge deposited on at least one of the electro-optic layer or the photoconductive layer.

42. The display of claim 40 wherein the means for applying an electric field comprises an electrode disposed on at least one side of the electro-optic layer or the photoconductive layer.

* * * * *

UNITED STATES PATENT AND TRADEMARK OFFICE
CERTIFICATE OF CORRECTION

PATENT NO. : 6,704,133 B2
DATED : March 9, 2004
INVENTOR(S) : Gates et al.

It is certified that error appears in the above-identified patent and that said Letters Patent is hereby corrected as shown below:

Title page,
Item [56], References Cited, U.S. PATENT DOCUMENTS,
Below "4,314,013 A    2/1982    Chang", please add the following:
  -- 4,324,456 A    4/1982    Dalisa --
Below "5,371,815 A    12/1994    Poole", please add the following:
  -- 5,374,815 A    12/1994    Waterhouse et al. --
Below "6,064,784 A    5/2000    Whitehead et al.," please add the following:
  -- 6,067,185 A    5/2000    Albert et al. --

Signed and Sealed this

Tenth Day of August, 2004

JON W. DUDAS
*Acting Director of the United States Patent and Trademark Office*